(12) United States Patent
Agan et al.

(10) Patent No.: US 10,079,602 B1
(45) Date of Patent: Sep. 18, 2018

(54) UNIPOLAR LATCHED LOGIC CIRCUITS

(71) Applicant: TACHO HOLDINGS, LLC, St. Louis Park, MN (US)

(72) Inventors: Tommy Allen Agan, Maple Grove, MN (US); James John Lupino, St. Louis Park, MN (US)

(73) Assignee: TACHO HOLDINGS, LLC, St. Louis Park, MN (US)

( * ) Notice: Subject to any disclaimer, the term of this patent is extended or adjusted under 35 U.S.C. 154(b) by 0 days.

(21) Appl. No.: 15/729,470

(22) Filed: Oct. 10, 2017

(51) Int. Cl.
*H03K 19/00* (2006.01)
*H03K 19/20* (2006.01)

(52) U.S. Cl.
CPC ......... *H03K 19/0013* (2013.01); *H03K 19/20* (2013.01)

(58) Field of Classification Search
None
See application file for complete search history.

(56) References Cited

U.S. PATENT DOCUMENTS

| | | | |
|---|---|---|---|
| 6,801,056 B2 | 10/2004 | Forbes | |
| 7,408,386 B2* | 8/2008 | Yu | H03K 19/01714 326/83 |
| 8,570,066 B2* | 10/2013 | Park | H03K 19/20 326/112 |
| 2008/0258770 A1* | 10/2008 | Van Acht | H03K 19/017 326/88 |
| 2008/0315918 A1* | 12/2008 | Luo | H03K 19/09441 326/80 |
| 2017/0084754 A1 | 3/2017 | Shionoiri et al. | |
| 2017/0111046 A1 | 4/2017 | Sun et al. | |

FOREIGN PATENT DOCUMENTS

| | | |
|---|---|---|
| JP | 2017041635 A | 2/2017 |
| WO | 2016183687 A1 | 11/2016 |

* cited by examiner

*Primary Examiner* — Jany Richardson
(74) *Attorney, Agent, or Firm* — Kinney & Lange, P.A.

(57) ABSTRACT

Novel unipolar circuits and vertical structures are described which exhibit low stand-by power, low dynamic power, high speed performance, and higher density compared to conventional silicon CMOS circuitry. In one embodiment, a design methodology utilizing either a p-channel or n-channel transistor type such that each logic gate is clocked and the clocking mechanism provides the pull up or pull down. Further embodiments include novel designs of vertical unipolar logic gates which provides for high density. Ultra-short transistor channel lengths in vertical unipolar logic gates are fabricated with a deposition process—in lieu of a lithography process—thereby providing for high speed operation and low cost manufacturing.

20 Claims, 25 Drawing Sheets

UNIPOLAR LATCHED NOR GATE (N-type)

UNIPOLAR LATCHED NOR GATE (P-type)

SIX INPUT UNIPOLAR LATCHED NOR GATE (N-type)

CLOCK SIGNALS FOR N-Type UNIPOLAR LOGIC CIRCUITS

CLOCK SIGNALS FOR P-Type UNIPOLAR LOGIC CIRCUITS

VERTICAL UNIPOLAR LATCHED N-type NOR GATE CONNECTIONS

TOP CONNECTIONS (N-type, FIGs. 4A and 4B)

BOTTOM CONNECTIONS (N-type, FIGs. 4A and 4B)

VERTICAL UNIPOLAR LATCHED
P-type NOR GATE CONNECTIONS

TOP CONNECTIONS (P-type, FIGs. 4C and 4D)

BOTTOM CONNECTIONS (P-type, FIGs. 4C and 4D)

VERTICAL UNIPOLAR LATCHED NOR GATE CONNECTIONS (N-type, FIGs. 4I-4J)

1

UNIPOLAR LATCHED LOGIC CIRCUITS

BACKGROUND

Conventional complementary metal-oxide semiconductor (CMOS) technology integrated circuits employ both P-type (PMOS) and N-type (NMOS) transistors for high performance and low power logic. CMOS was patented in 1967 by Frank Wanlass of Fairchild Semiconductor (U.S. Pat. No. 3,356,858) and has since been the mainstream circuit technology for semiconductor manufacturing to-date. Unipolar logic using only N-type (NMOS) transistors or only P-type (PMOS) transistors may be employed, to reduce the cost of manufacturing. However, high stand-by power of such methods to-date has prohibited unipolar logic from being utilized on a large scale. The continued advancements in the semiconductor and flat panel display industries have yielded new types of transistor materials to be considered for integrated circuits. Some materials such as thin film amorphous metal oxides are low cost and may be fabricated monolithically in 3D structures thereby enabling true monolithic 3D integrated circuits Developments in organic thin film transistors enable printing of TFTs on flexible substrates in roll-to-roll manufacturing processes. Furthermore, compound semiconductors such as GaN, InAs, InGaAs and GaAs exhibit electron mobility much higher than silicon and therefore are promising candidates to replace silicon. However, these thin film and compound semiconductor transistors are mainly implemented in only N-type or P-type, but not both. A new circuit design is therefore required to enable low stand-by power and low dynamic power unipolar logic in order for such new transistor materials to reach a large scale in the electronics industry.

SUMMARY

Novel unipolar circuits and vertical structures are described which exhibit low stand-by power, low dynamic power, high speed performance, and higher density compared to conventional silicon CMOS circuitry. In one embodiment, a design methodology utilizes either a p-channel or n-channel transistor type such that each logic gate is clocked and the clocking mechanism provides the pull up or pull down. Further embodiments include novel designs of vertical unipolar logic gates which provide for high density. Ultra-short transistor channel lengths in vertical unipolar logic gates are fabricated with a deposition process—in lieu of a lithography process—thereby providing for high speed operation and low cost manufacturing.

DEFINITION OF DRAWING NUMERALS AND NOTATIONS

10—CLK Signal, Unipolar Latched Gate
10-B—CLK (10) signal connection from Bottom of Vertical Unipolar Latched Gate
10-T—CLK (10) signal connection from Top of Vertical Unipolar Latched Gate
11—Capacitor, Unipolar Latched Gate
12—$\overline{CLK}$ Signal, Unipolar Latched Gate
13, 14, 23, and 24—Transistors, Unipolar Latched Gate
15—Thin dielectric layer of capacitor (11)
16—Capacitor of RC Circuit (26), Unipolar Latched Gate
17—Common CLK (or $\overline{CLK}$) via connection for adjacent Unipolar Logic Gates
18—First (top) electrode of capacitor (11)
19—Second (bottom) electrode of capacitor (11)
20—Electrode connecting gate to transistor (13), an electrode of capacitor (11) and a terminal of transistors (14, 23, and 24)
21—First (top) electrode of capacitor (11) of adjacent gate
22—Electrode connecting CLK (10) top (10-T) and bottom (10-B) connections
25—Resistor of RC Circuit (26), Unipolar Latched Gate
26—RC Network in Unipolar Latched Gate
31—Vdd
33—A input to Unipolar Latched Gate
34—B input to Unipolar Latched Gate
35—Output of Unipolar Latched Gate
36—Ground (Vss)
38—Routing channel (via) between top and bottom routing layers of a vertical unipolar latched logic array
41—A first unipolar latched NOR logic gate (N-type) of a series of sequential logic gates
42—A first unipolar latched NOR logic gate (N-type) of a series of sequential logic gates
43—A second unipolar latched NOR logic gate (N-type) of a series of sequential logic gates
50—Semiconductor substrate of a hybrid unipolar latched logic integrated circuit
51—Base unipolar latched logic circuitry of a first material
52—Unipolar latched logic circuitry of a second material
53—Routing layer of a hybrid unipolar latched logic integrated circuitry
54—Graph of electrical signals of a Unipolar Latched Logic Circuit
55—Horizontal axis indicative of time
56—vertical axis indicative of voltage of a clock signal
57—clock signal/time relation
57a—First phase (evaluation phase)
57b—Second phase (hold phase)
58—vertical axis indicative of voltage of a logic input signal
59—input logic signal/time relation
60—vertical axis indicative of voltage of a logic output signal
61—output logic signal/time relation
62—Graph of electrical signals of a Unipolar Latched Logic Circuit
63—vertical axis indicative of clock and supply current
64—supply current/time relation
65—clock current/time relation
102—Logic network
104—Pre-Evaluation Net of Unipolar Latched Gate
110—CLK Signal, Unipolar Latched Gate
111—Capacitor, Unipolar Latched Gate
113, 114, 123 and 124—Transistors, Unipolar Latched Gate
131—Vdd
133—A input to Unipolar Latched Gate
134—B input to Unipolar Latched Gate
135—Output of Unipolar Latched Gate
$t_{r10}$—Rise time of CLK (10)
$t_{f10}$—Fall time of CLK (10)
$t_{on10}$—Enable (high) time during CLK (10) cycle, for N-type unipolar latched logic gate
$t_{off10}$—Enable (low) time during CLK (10) cycle, for P-type unipolar latched logic gate
$t_{r12}$—Rise time of $\overline{CLK}$ (12)
$t_{f12}$—Fall time of $\overline{CLK}$ (12)
$t_{on12}$—Enable (high) time during $\overline{CLK}$ (12) cycle, for N-type unipolar latched logic gate
$t_{off12}$—Enable (low) time during $\overline{CLK}$ (12) cycle, for P-type unipolar latched logic gate
$t_p$—Period time of one clock cycle
$\tau_{su}$—Set-up time ULL—Unipolar Latched Logic
$V_t$—Voltage threshold of transistor (13)

DETAILED DESCRIPTION

In the description herein, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower", "upper", "beneath", "below", "above", "bottom" and "top", if used herein, are utilized for ease of description to describe spatial relationships of an element(s) to another. Such spatially related terms encompass different orientations of the device in use or operation in addition to the particular orientations depicted in the figures and described herein. For example, if a cell depicted in the figures is turned over or flipped over, portions previously described as below or beneath other elements would then be above those other elements.

As used herein, when an element, component or layer for example is described as being "on" "connected to", "coupled with" or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as begin "directly on", "directly connected to", "directly coupled with", or "directly in contact with" another element, there are no intervening elements, components or layers for example.

Figure 1A:
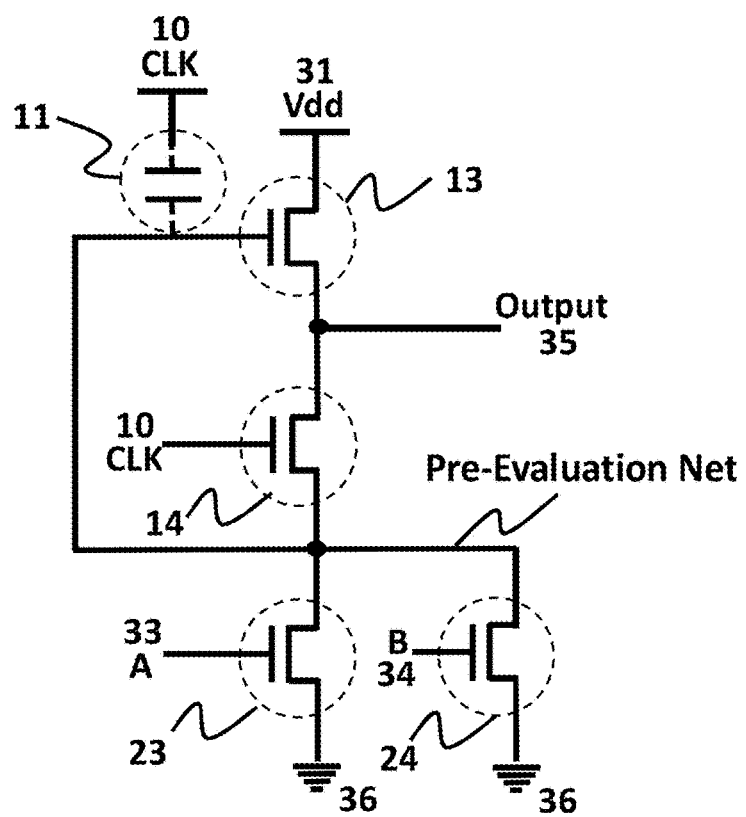
FIG. 1A is a schematic diagram of a Unipolar Latched NOR Gate Circuit (N-type transistors) according to an embodiment of the present invention.

FIG. 1A is a schematic diagram of a unipolar latched NOR gate circuit (N-type) according to an embodiment of the present invention.

Figure 2A:
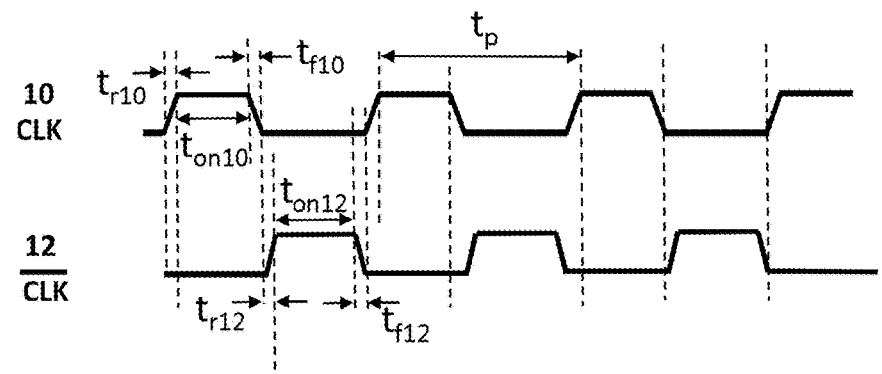
FIG. 2A is a timing diagram showing CLK and $\overline{CLK}$ signals for N-type Unipolar Latched Logic Circuits according to an embodiment of the present invention.

When CLK (10) is driven high, and both A (33) and B (34) are at a low voltage, capacitor (11) is capacitively pulled, during the time $t_{r10}$, indicated on FIG. 2A, to a positive voltage sufficient in magnitude to turn transistor (13) on and drive Output (35) to a high value of $V_t$ plus design margin. If either A (33) or B (34) is high, one or both of transistors (23) and (24) will be on, preventing the bottom electrode of capacitor (11) from charging high enough to turn transistor (13) on. Thus, transistor (13) does not charge Output (35) to $V_t$ plus design margin, a logically high voltage. Further, when CLK (10) is driven high, transistor (14) will be on, and if either transistor (23) or (24) is on, there is a path for Output (35) to be pulled to Ground (36), a logically low value. Thus, when either transistor (23) or (24) is on, Output (35) goes low when CLK (10) is asserted, and if both transistor (23) and (24) are off, Output (35) goes high when CLK (10) is asserted. Note that the Output (35) changes when the CLK (10) is high and is latched when CLK (10) is low.

When CLK (10) is driven low the gate to transistor (13) is pulled low, turning transistor (13) off. Additionally, when CLK (10) is driven low, transistor (14) is turned off. This leaves Output (35) not being driven while CLK (10) is low. Output (35) should retain its value from the voltage stored on the capacitive load. If the load is insufficient to maintain the correct voltage during a clock cycle, an additional capacitor can be added at the output.

The only time Output (35) can be driven high or low is when CLK (10) is high.

Notice that when CLK (10) is rising, and both A (33) and B (34) are off, and the bottom electrode of capacitor (11) begins to rise turning on transistor (13). At the same time, when CLK (10) rises, it turns on transistor (14). Transistor (14) being on opens a pathway from Output (35) to the bottom electrode of capacitor (11). There is a path as Output (35) is rising to take current from the bottom electrode of capacitor (11) through transistor (14). This may reduce the voltage on the bottom electrode of capacitor (11) which reduces the voltage on the gate of transistor (13) which in turn reduces the voltage on Output (35). This can be remedied by the addition of an RC network (26) consisting of resistor (25) and capacitor (16), as per FIG. 1C, which creates a time constant preventing the Output (35) from lowering the gate voltage of transistor (13). Note that the Output (35) is not required to swing rail to rail—as in conventional CMOS logic—but rather from Ground to $V_t$ plus design margin.

Figure 4A:
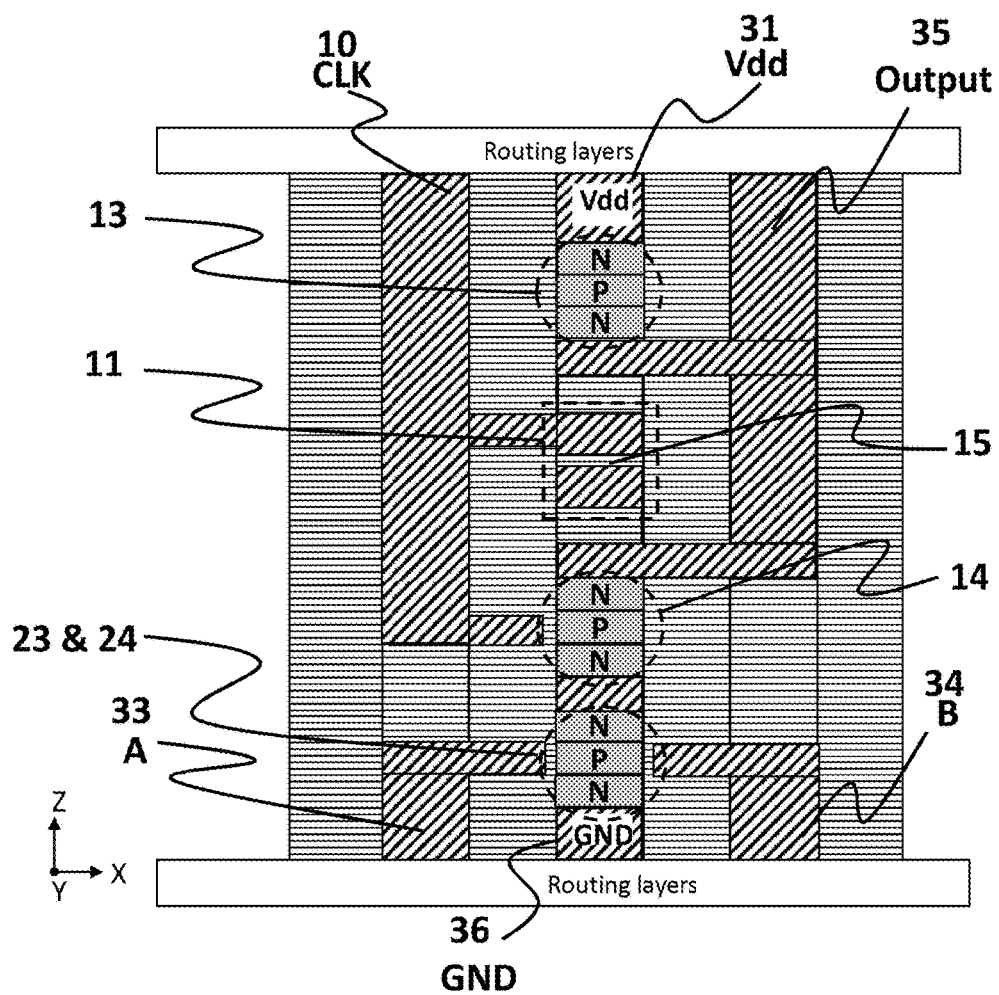
FIG. 4A is a Cross-sectional view of a Vertical Structure of a Unipolar Latched NOR Gate (N-type) according to an embodiment of the present invention.
Figure 4B:
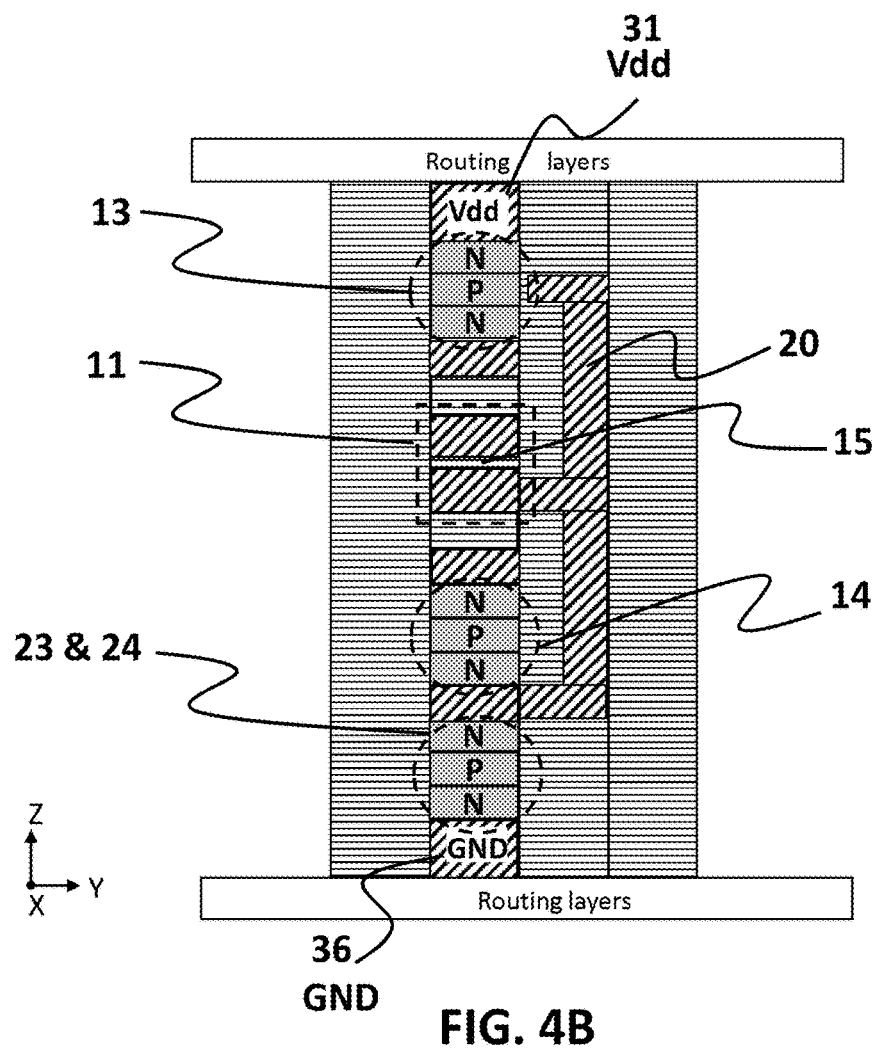
FIG. 4B is a Cross-sectional view of a Vertical Structure of a Unipolar Latched NOR Gate (N-type) according to an embodiment of the present invention.
Figure 4C:
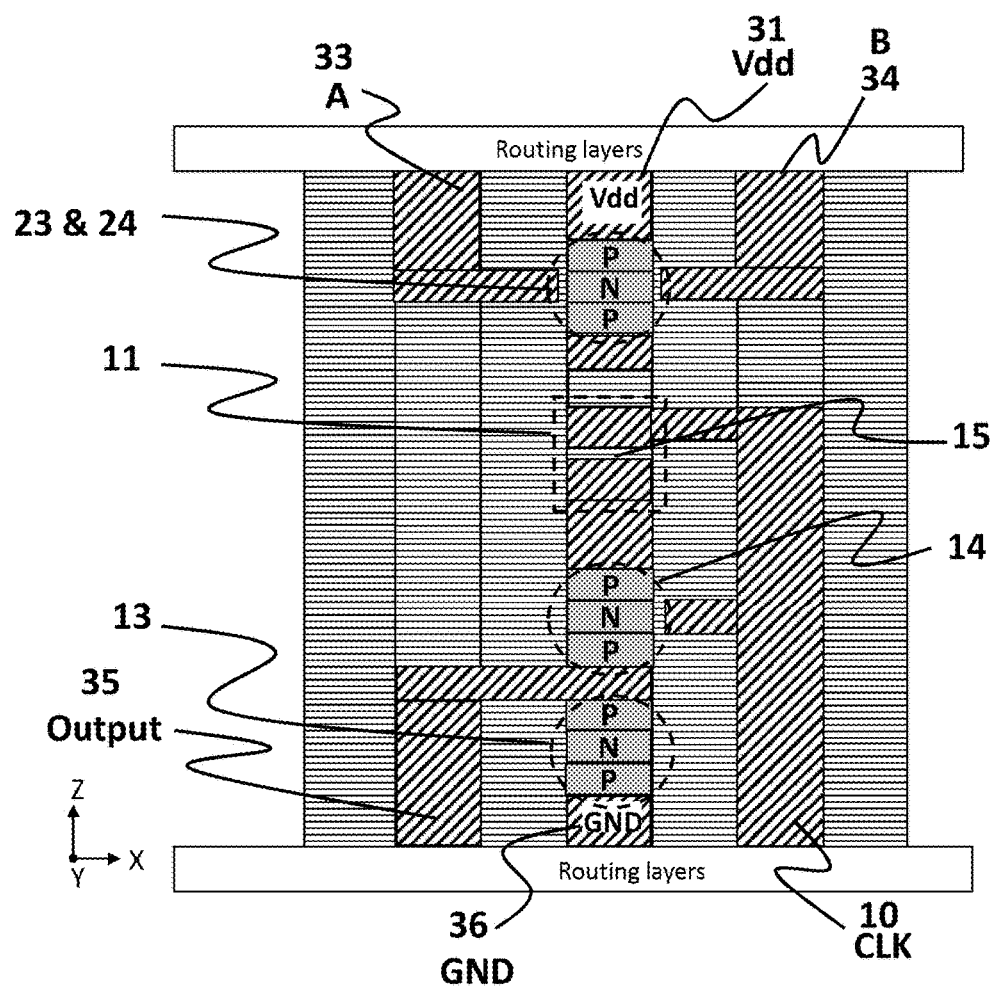
FIG. 4C is a Cross-sectional view of a Vertical Structure of a Unipolar Latched NOR Gate (P-type) according to an embodiment of the present invention.
Figure 4D:
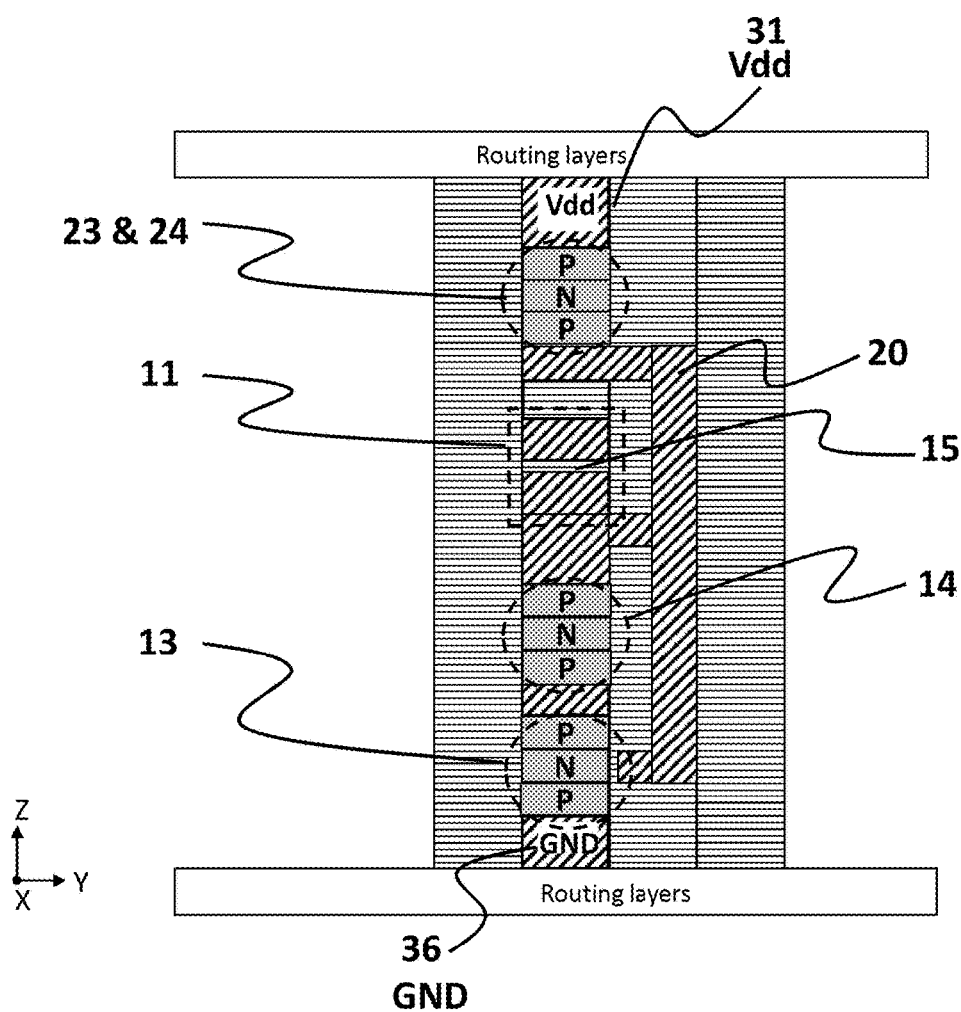
FIG. 4D is a Cross-sectional view of a Vertical Structure of a Unipolar Latched NOR Gate (P-type) according to an embodiment of the present invention.
Figure 4E:
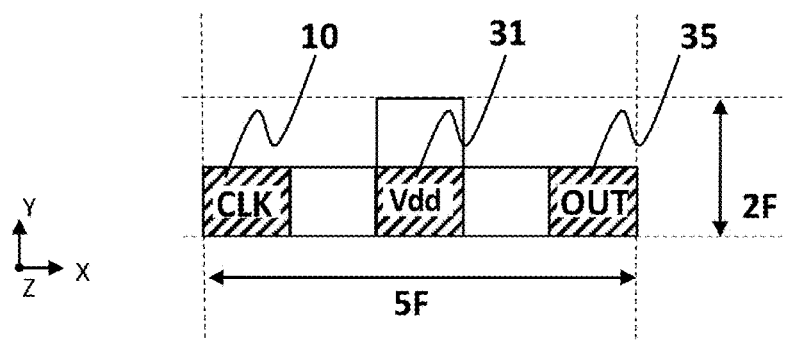
FIG. 4E are plan views of the Top Layer Connections and the Bottom Layer Connections, respectively, of a Vertical Unipolar Latched N-type NOR Gate according to embodiments of the present invention.
Figure 4E:
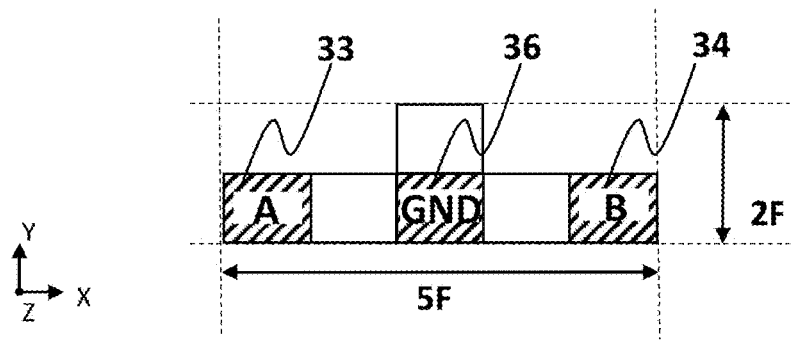
Figure 4F:
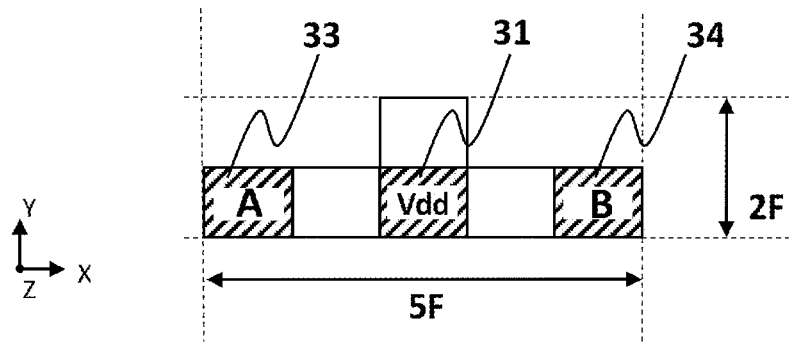
FIG. 4F are plan views the Top Layer Connections and Bottom Layer Connections, respectively, of a Vertical Unipolar Latched P-type NOR Gate according to embodiments of the present invention.
Figure 4F:
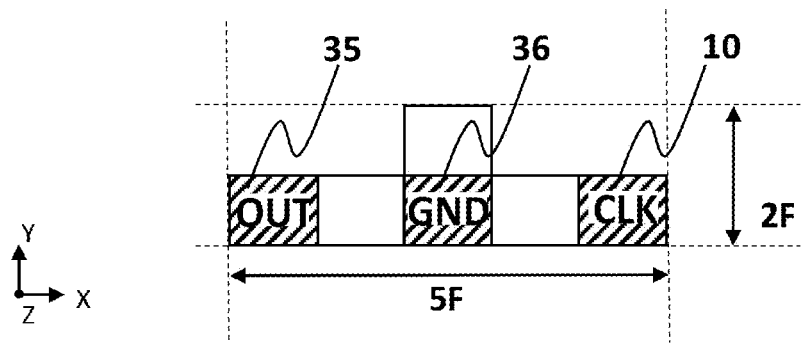
Figure 4G:
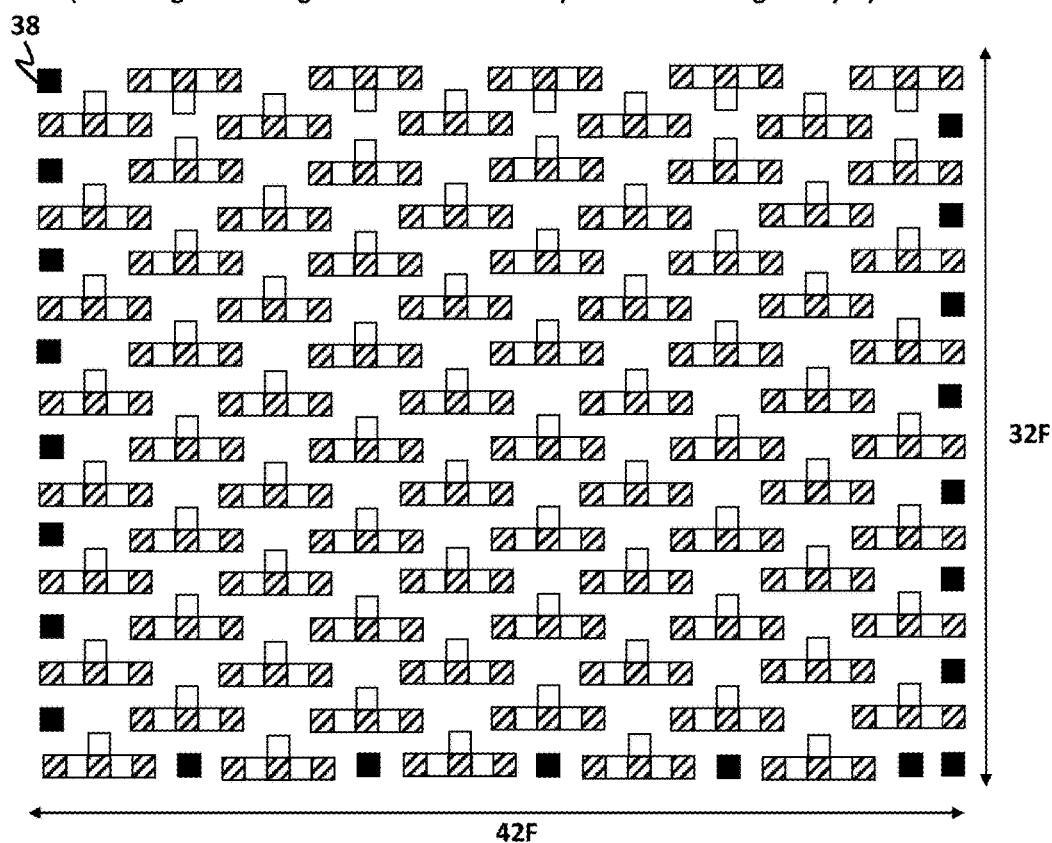
FIG. 4G is a plan view of an array of Vertical Unipolar Latched Gates with an average cell size approximately equal to 17 $F^2$ according to an embodiment of the present invention.
Figure 4H:
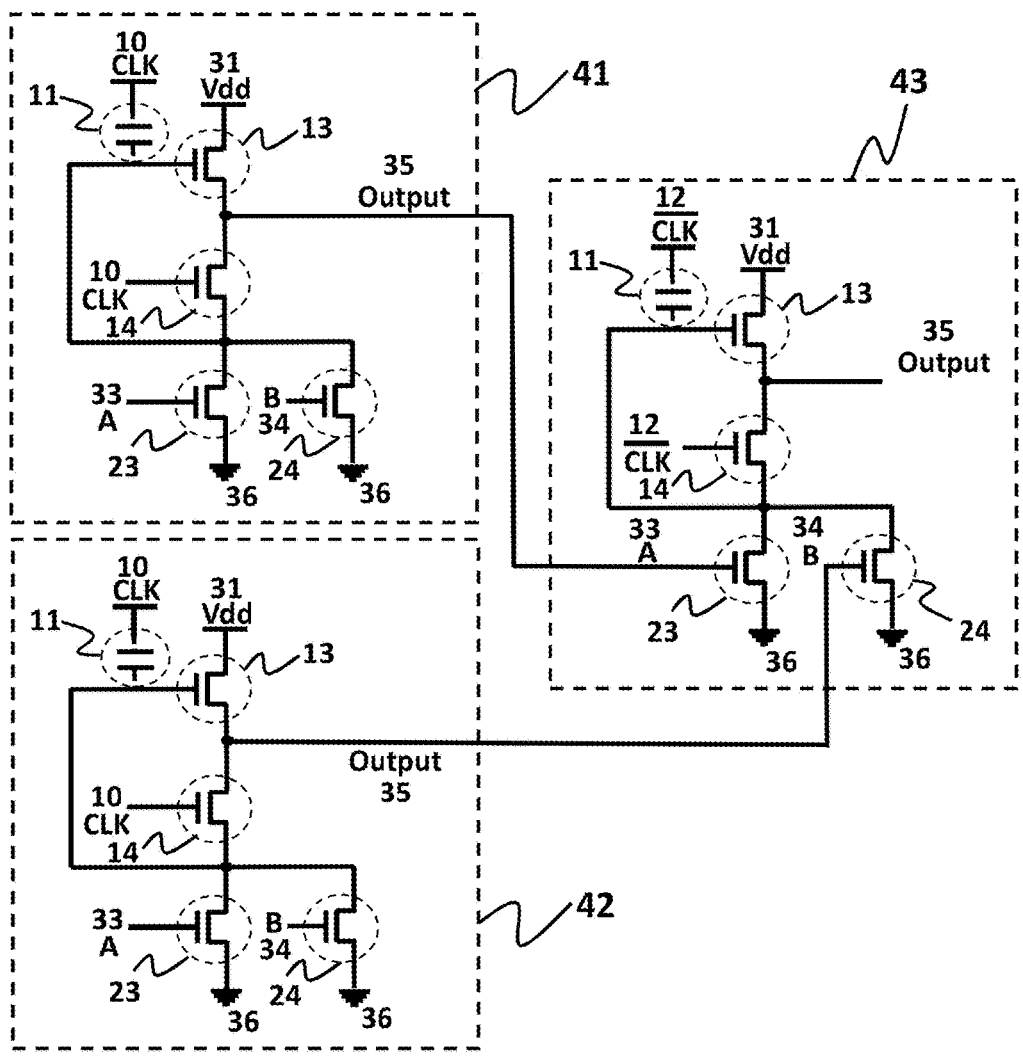
FIG. 4H is a schematic diagram of a Sequential Unipolar Latched NOR Logic Gates (N-type) according to an embodiment of the present invention.

FIG. 4H shows sequential unipolar latched NOR gates (N-type). Notice that the first unipolar latched gates (41) and (42) in the sequence are clocked by CLK (10), and the second unipolar latched gate (43) in the sequence is clocked by $\overline{CLK}$ (12). To maintain signal integrity, each gate in a sequence is clocked by the opposite clock of the previous gate. The inputs of the second unipolar latched gate (43), provide capacitance to store the value of the outputs of the first gates (41, 42) during the time which the first gates' clocks are low. FIG. 2A shows the CLK (10) and $\overline{CLK}$ (12) signals for unipolar latched NOR gates (N-type) according to embodiments of the present invention.

Not all paths are of equal length in a circuit design. Historically, between pairs of sequential latches, there may be some paths with a small number of gates and some paths with a larger amount of gates. Since each gate in unipolar logic is latched, a mechanism is needed to synchronize paths of different length. One mechanism to synchronize the paths is a clock control circuit configured to clock the appropriate gates at the right time so the output of the gates are settled before being latched and/or clocked. The clock mechanism only clocks the gate when necessary, meaning that for many clock cycles the gate may not be clocked but instead holds its previous latched value. This can result in significant power savings. However, since the state of the output is being held by the loading capacitance of the gate for an extended period of time between clocking events, it is possible that the clock may not assert in time to prevent decay of the data, resulting in data corruption. When the adjusted clock is sufficiently slow that the data may decay, a data refresh circuit may be required. Such data refresh circuit may consist of a flip flop of the unipolar type and be configured to ensured that the clock will assert itself in sufficient time to prevent data decay. Increasing the capacitive loading on the output gate can also extend the hold time between adjacent refresh and/or clocking events.

Figure 1B:
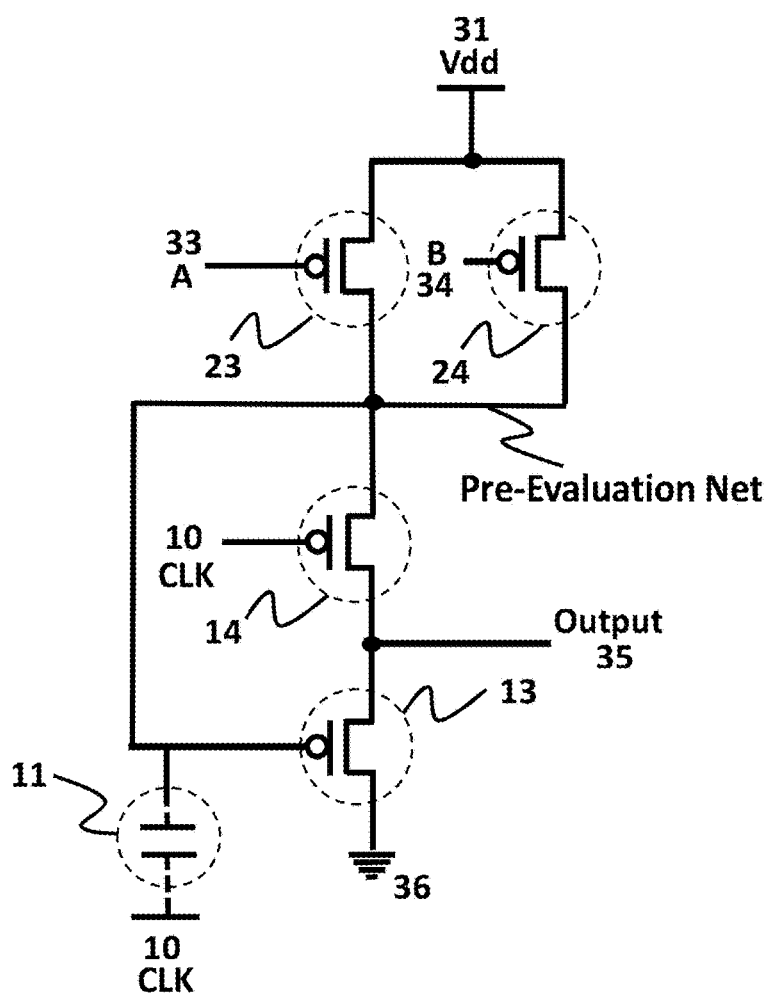
FIG. 1B is a schematic diagram of a Unipolar Latched NOR Gate Circuit (P-type transistors) according to an embodiment of the present invention.
Figure 1C:
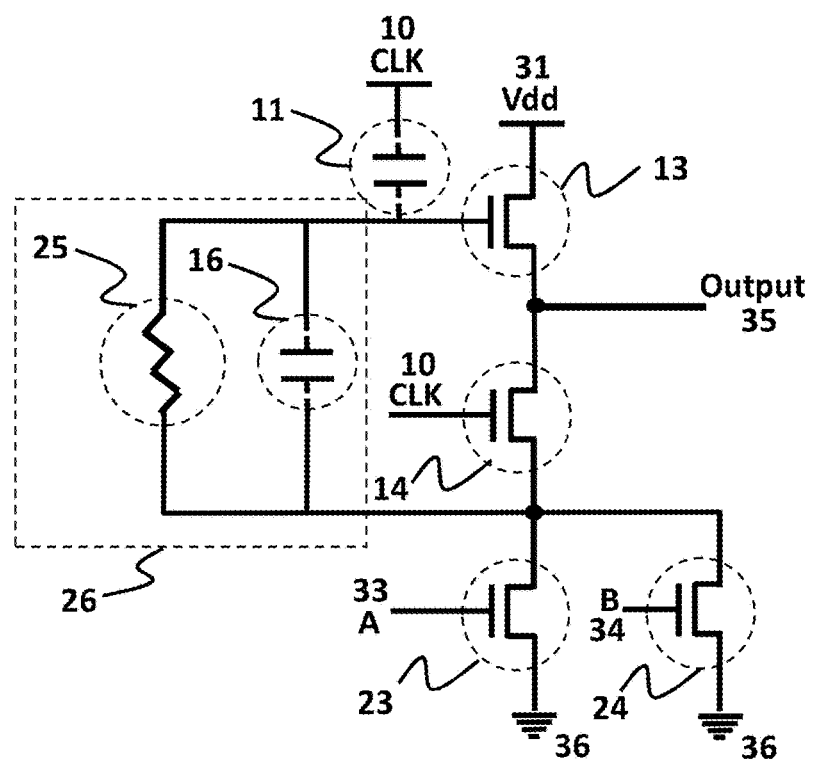
FIG. 1C is a schematic diagram of a Unipolar Latched NOR Gate Circuit (N-type transistors) with RC Network according to an embodiment of the present invention.

FIG. 1B is a schematic diagram of a unipolar latched NOR gate circuit (P-type) according to an embodiment of the present invention.

Figure 2B:
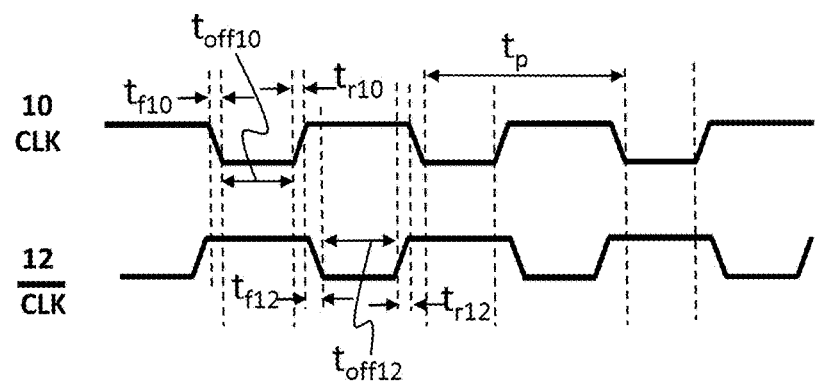
FIG. 2B is a timing diagram showing CLK and $\overline{CLK}$ signals for P-type Unipolar Latched Logic Circuits according to an embodiment of the present invention.

When CLK (10) is driven low, and both A (33) and B (34) are at a high voltage, capacitor (11) is capacitively discharged, during the time $t_{f10}$, indicated on FIG. 2B, to a sufficient voltage to turn transistor (13) on and drive Output (35) to a low value of Vdd (31) minus $V_t$ minus design margin. If either A (33) or B (34) is low, one or both of transistors (23) and (24) will be on, preventing the bottom electrode of capacitor (11) from discharging low enough to turn transistor (13) on. Thus, transistor (13) is off and does not discharge Output (35); rather Output (35) is pulled to a high value of Vdd (31) through transistor (14) and either transistor (23) or (24) or both. Further, when CLK (10) is driven low, transistor (14) will be on, and if either transistor (23) or (24) is on, there is a path for Output (35) to be charged to Vdd (31), a logically high value. Thus, when either transistor (23) or (24) is on, Output (35) goes high when CLK (10) is asserted, and if both transistor (23) and (24) are off, Output (35) goes low when CLK (10) is asserted. Note that the Output (35) changes when the CLK (10) is low and is latched when CLK (10) is high.

When CLK (10) is driven high the gate to transistor (13) is high turning transistor (13) off. Additionally, when CLK (10) is driven high, transistor (14) is turned off. This leaves Output (35) not being driven while CLK (10) is high. Output (35) should retain its value from the voltage stored on the capacitive load. If the load is insufficient to maintain the correct voltage during a clock cycle, an additional capacitor can be added at the output.

The only time Output (35) can be driven high or low is when CLK (10) is low.

Figure 1D:
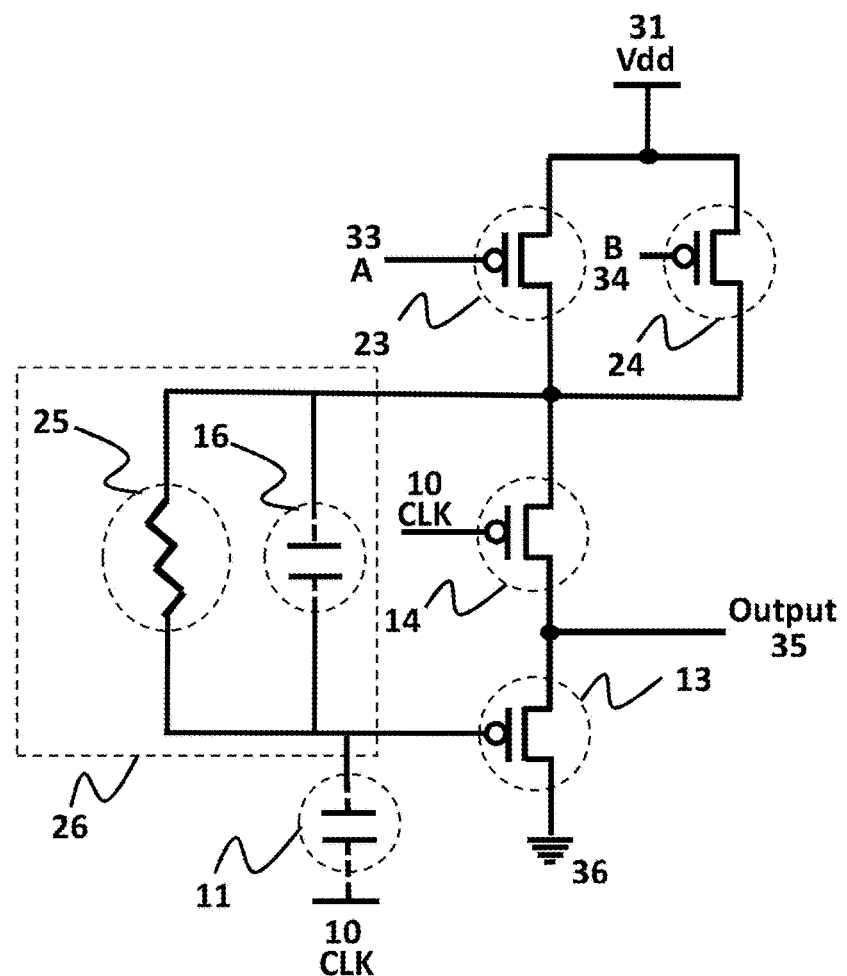
FIG. 1D is a schematic diagram of a Unipolar Latched NOR Gate Circuit (P-type transistors) with RC Network according to an embodiment of the present invention.

Notice that when CLK (10) is falling, and both A (33) and B (34) are both off, the bottom electrode of capacitor (11) begins to fall turning on transistor (13). At the same time, when CLK (10) falls, it turns on transistor (14). Transistor (14) being on opens a pathway from Output (35) to the bottom electrode of capacitor (11). There is a discharge path from Output (35) to the bottom electrode of capacitor (11) through transistor (14). This may increase the voltage on the bottom electrode of capacitor (11) which increases the voltage on the gate of transistor (13) which in turn prevents the voltage on Output (35) from falling. This can be remedied by the addition of an RC network (26) consisting of resistor (25) and capacitor (16), as per FIG. 1D, which creates a time constant preventing the Output (35) from increasing the gate voltage of transistor (13). Note that the Output (35) is not required to swing rail to rail—as in conventional CMOS logic—but rather from Vdd (31) to Vdd minus $V_t$ minus design margin.

There are numerous reasons for implementing unipolar logic. Unipolar logic is not often used because of the drawbacks of implementing unipolar logic. For example, conventional prior art NMOS logic utilizes a resistor to pull the voltages high. These resistors draw current too much of the time resulting in high power consumption. If the resistors are higher valued to reduce to power consumption, the speed suffers (i.e., speed is reduced). Other methods known in the art require too many transistors and tend to be slow speed compared to conventional CMOS. As known in the art, system speed has been increasing for some time and as of late the increases in speed have slowed. Historically there have been two methods to increase the speed. One method is a reduction in gate length which increases transistor speed and increases density which decreases parasitic losses due to capacitance, inductance and resistance. The other method is to reduce the path length from latch to latch.

The unipolar latched logic methods outlined herein improve the clock speed by reducing the logic path between gates to a minimum. Effectively, every gate is clocked providing for a maximum of clock speed. Clocking each gate in conventional CMOS logic is not often done due to the increase in number of latches that would be required. With approximately 8 transistors per latch, that would be not feasible. The methods outlined herein utilize a clock at each gate to generate the voltage so there is no loss due to threshold voltage drop.

FIG. 2A and FIG. 2B are schematic diagrams of CLK (10) and $\overline{\text{CLK}}$ (12) signals for N-type and P-type Unipolar Latched Logic Circuits respectively according to embodiments of the present invention. The CLK (10) and $\overline{\text{CLK}}$ (12) signals are asymmetrical to each other. The enable (high) times $t_{on10}$ and $t_{on12}$ for CLK (10) and $\overline{\text{CLK}}$ (12) respectively, for N-type unipolar latched logic gates (FIG. 2A), need not be equal, although typically they will be. For P-type unipolar latched logic gates (FIG. 2B), the enable (low) times $t_{off10}$ and $t_{off12}$ for CLK (10) and $\overline{\text{CLK}}$ (12) respectively, need not be equal, although typically they will be. In certain circumstances, it may be advantageous to vary the enable times.

Figure 3A:
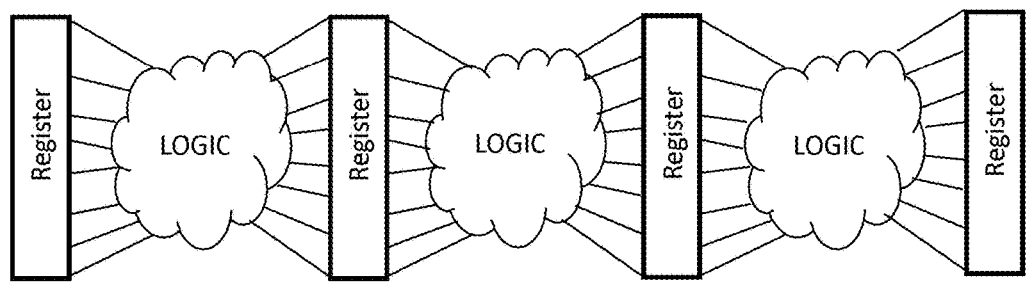
FIG. 3A is a schematic diagram of Logic blocks according to the prior art.

FIG. 3A is a diagram illustrating logic blocks according to the prior art. Conventional circuit designs can employ registers interposed between blocks of logic. Such interposed registers can be called pipeline design of logic. In this pipeline design, there is an inherent design tradeoff pertaining to the amount of logic placed between the registers. For a faster clock, the designer would minimize the logic between the registers. While this provides for a faster clock, it requires more registers. For a smaller overall design size, the designer would maximize the amount of logic between the registers which would slow the clock. A maximum clock speed can be limited by the setup and hold time of the register plus the delay time of the blocks of logic. For maximum clock speed, a single gate is preferable between the registers.

Figure 3B:
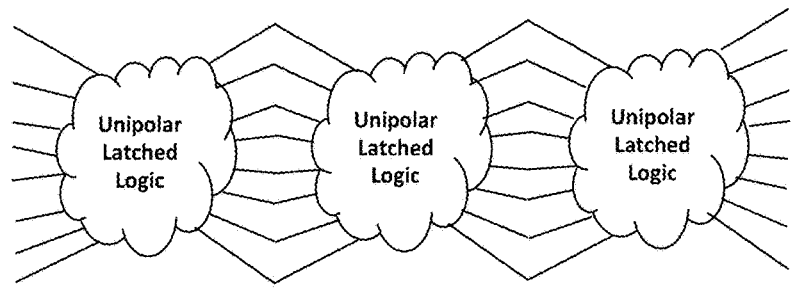
FIG. 3B is a schematic diagram of Unipolar Latched Logic according to an embodiment of the present invention.

FIG. 3B is a diagram illustrating unipolar latched logic according to an embodiment of the present invention. In contrast to FIG. 3A, separate registers are not needed for unipolar latched logic because each gate acts as its own register. Further, the load capacitance acts as a storage element to store the output state, similar to the capacitor which stores the state of a DRAM bit. This differs from CMOS which allows signal line glitching between register blocks. The elimination of glitching can dramatically reduce power consumption for some data sets. The clock speed for such latched logic cells can be determined by the time is takes to charge the load capacitance on a single gate. Therefore, the clock speed of the present invention can be much higher than that required by standard CMOS logic. While latency may or may not be improved, data throughput will be much improved.

One important feature of the unipolar latched logic design to improve performance is to design capacitor (11) to be sized appropriately. When sized appropriately, the power consumption is minimized and the speed of the logic gate is improved. The physical sizing of the capacitor (11) is dependent on the feature size of the process technology node, the thickness of the dielectric (15) and the loading capacitance of the transistors.

Figure 1E:
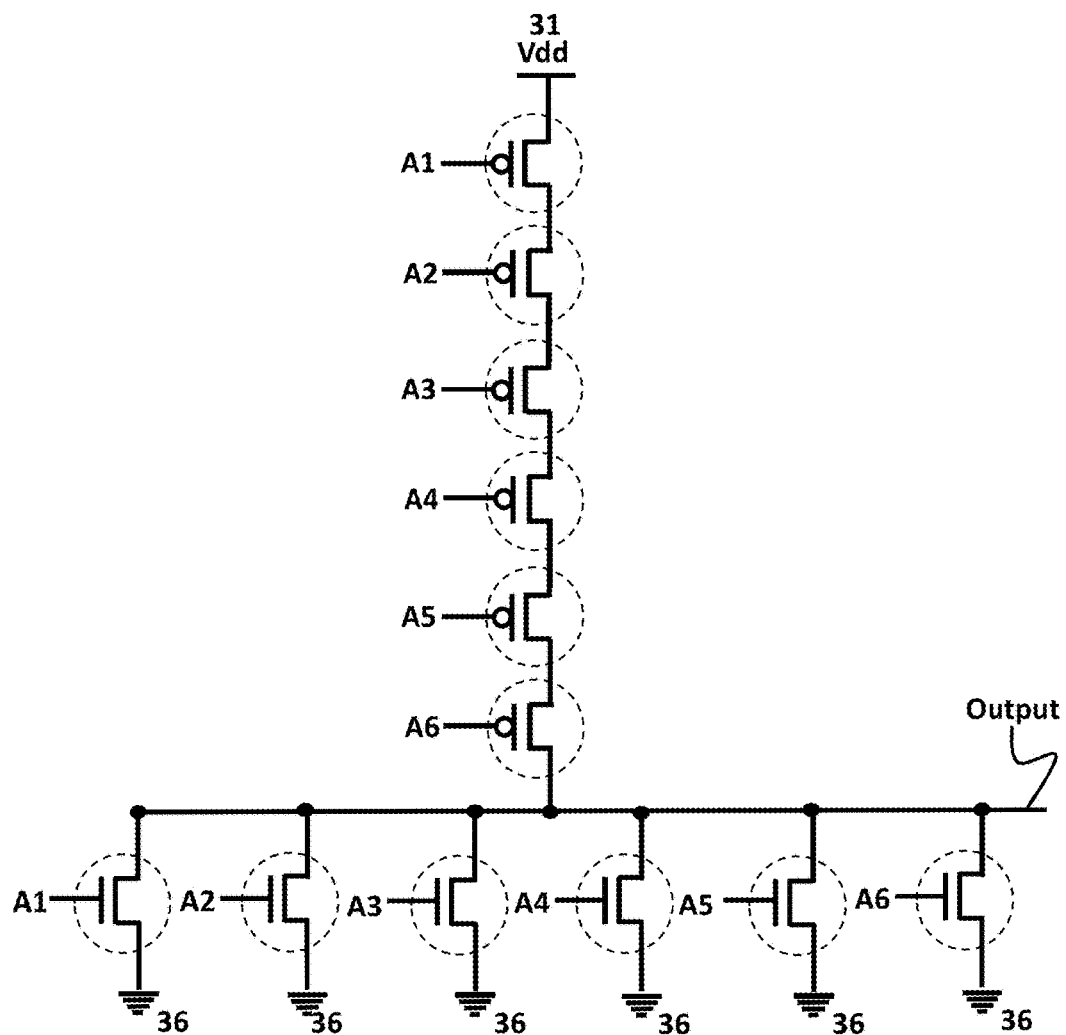
FIG. 1E is a schematic diagram of a Six-Input NOR Gate Circuit (CMOS) according to the prior art
Figure 1F:
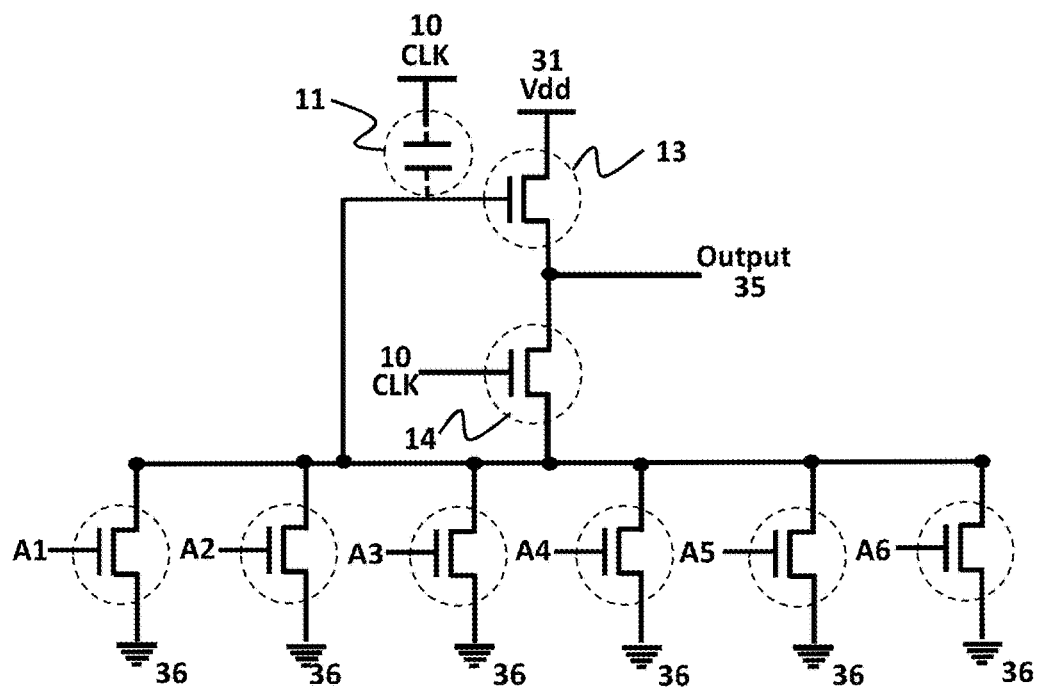
FIG. 1F is a schematic diagram of a Six-Input Unipolar Latched Logic NOR Gate Circuit (N-type) according to an embodiment of the present invention.

A significant advantage of the unipolar latched logic (ULL) invention disclosed herein relates to the reduction of the number of transistors for complex gates. Complex gates are rarely employed in conventional CMOS due to the sizing challenges of the low-mobility PMOS transistors—in particular those arranged in series—compared to the higher mobility NMOS transistors in order to balance the pull-up (PMOS based) network and pull-down (NMOS based) network. Table 1 below shows the number of transistors for various gates based on conventional CMOS logic (# T-CMOS) vs. the number of transistors for various gates based on ULL (# T-ULL). For low input gates such as a 2-input NOR or NAND gate, the number of transistors equally number four (4) for either CMOS or ULL. For a high input gate such as a 6-input NOR gate, the number of transistors for ULL is eight (8), one-third less than the twelve (12) transistors required for CMOS as indicated in FIG. 1E (prior art CMOS) and FIG. 1F (ULL). The ratio of the number of ULL transistors compared to conventional CMOS transistors for NOR or NAND gates, as a function of the number of inputs (n), is equal to n+2 (ULL), compared to 2n (CMOS). Hence, there is a significant advantage in utilizing complex gates in circuit designs with ULL by enabling fewer transistors and avoiding transistor sizing challenges related to balancing the pull-up and pull-down networks associated with conventional CMOS technology. This provides new opportunities for designers to further reduce die size, improve speed, and reduce power by employing ULL-based complex gates in lieu of conventional CMOS-based complex gates.

TABLE 1

No of transistors - Conventional CMOS gates vs. ULL gates

| Gate type: | In-verter | NAND/NOR | | | | | | Full Adder (typical) |
|---|---|---|---|---|---|---|---|---|
| # inputs: | 1 | 2 | 3 | 4 | 5 | 6 | ... n | 3 |
| # T-CMOS: | 2 | 4 | 6 | 8 | 10 | 12 | ... 2n | 34 |
| # T-ULL: | 3 | 4 | 5 | 6 | 7 | 8 | ... n + 2 | 22 |

FIG. 4A, FIG. 4B, FIG. 4I and FIG. 4J are cross-sectional views of a vertical structure of a unipolar latched NOR gate (N-type) according to an embodiment of the present invention. Vertical logic gates are described in applications 62/252,522 filed, Nov. 8, 2015 and PCT/US2016/24173, filed Mar. 25, 2016; these applications are incorporated by reference herein in their entirety. FIGS. 4A, 4B, 4I, and 4J are cross-sectioned in quadrature planes (planes whose normal vectors are orthogonal to one another). FIGS. 4A, 4B, 4I and 4J section through an active column (e.g., a column of semiconductor material in which active devices can be fabricated). The semiconductor layers of transistors (13, 23, 24 and 14) of FIG. 1A are all fabricated in a single stack. The transistor channel lengths are determined by deposition and not by lithography. This allows very high density circuitry and very high speed. The manufacturing methodology for fabricating the structures shown in FIGS. 4A and 4B and FIGS. 4I and 4J, can be similar to methods employed by the flash memory industry for making 3D NAND flash and other 3D non-volatile memory devices. The gates of the transistors may be of the surrounding gate type thereby permitting better performance. Transistors (23) and (24) are shown to have a common semiconductor stack but dual gates for the inputs A (33) and B (34). Alternatively, one may separate the transistors with separate semiconductor stacks and dedicated gates for the respective inputs A (33) and B (34).

FIG. 4C and FIG. 4D are cross-sectional views of a vertical structure of a unipolar latched NOR gate (P-type) according to an embodiment of the present invention. Vertical logic gates are described in applications 62/252,522 filed, Nov. 8, 2015 and PCT/US2016/24173, filed Mar. 25, 2016; these applications are incorporated by reference herein in their entirety. FIGS. 4C and 4D are cross-sectioned in quadrature planes (planes whose normal vectors are orthogonal to one another). Both FIGS. 4C and 4D section through an active column (e.g., a column of semiconductor material in which active devices can be fabricated). The semiconductor layers of transistors (13, 23, 24 and 14) of FIG. 1B are all fabricated in a single stack. The transistor channel lengths are determined by deposition and not by lithography. This allows very high density circuitry and very high speed. The manufacturing methodology for fabricating the structure shown in FIG. 4C and FIG. 4D can be similar to methods employed by the flash memory industry for making 3D NAND flash and other 3D non-volatile memory devices. The gates of the transistors may be of the surrounding gate type thereby permitting better performance.

FIG. 4E shows top views of the top and bottom layer connections of a vertical unipolar latched logic gate (N-type), per the structures depicted in FIGS. 4A and 4B, according to an embodiment of the present invention, and FIG. 4F shows top views of the top and bottom layer connections of a vertical unipolar latched logic gate (P-type), per the structures depicted in FIGS. 4C and 4D, according to an embodiment of the present invention. Connections for gate routing may be made to the vertical gates either from above or below the gate structure. CLK (10) is connected from the top of the gate structure. To maximize density in the N-type gate, the output (35) is connected from the top only and inputs A (33) and B (34) are only connected from the bottom as indicated in FIG. 4E. To maximize density in the P-type gate, the output (35) is connected from the bottom only and inputs A (33) and B (34) are only connected from the top as indicated in FIG. 4F. Alternatively, output (35), A (33) and B (34) may be routed to both the top and bottom routing layers, however, that would require an increase of the gate cell area. Other arrangements of connections may also be made without departing from the spirit of the invention which enables flexibility in design of 3D circuitry by providing for connections at routing layers above and/or below the gate array. FIG. 4G is an illustration of one method of creating an array of Vertical Unipolar Latched NOR Gates with an average cell size approximately equal to 17 $F^2$ according to an embodiment of the present invention. The routing channels or vias (38) between the top and bottom routing layers of the gate array provides the designer with flexibility in design to best ensure the design does not become routing limited.

Figure 4I:
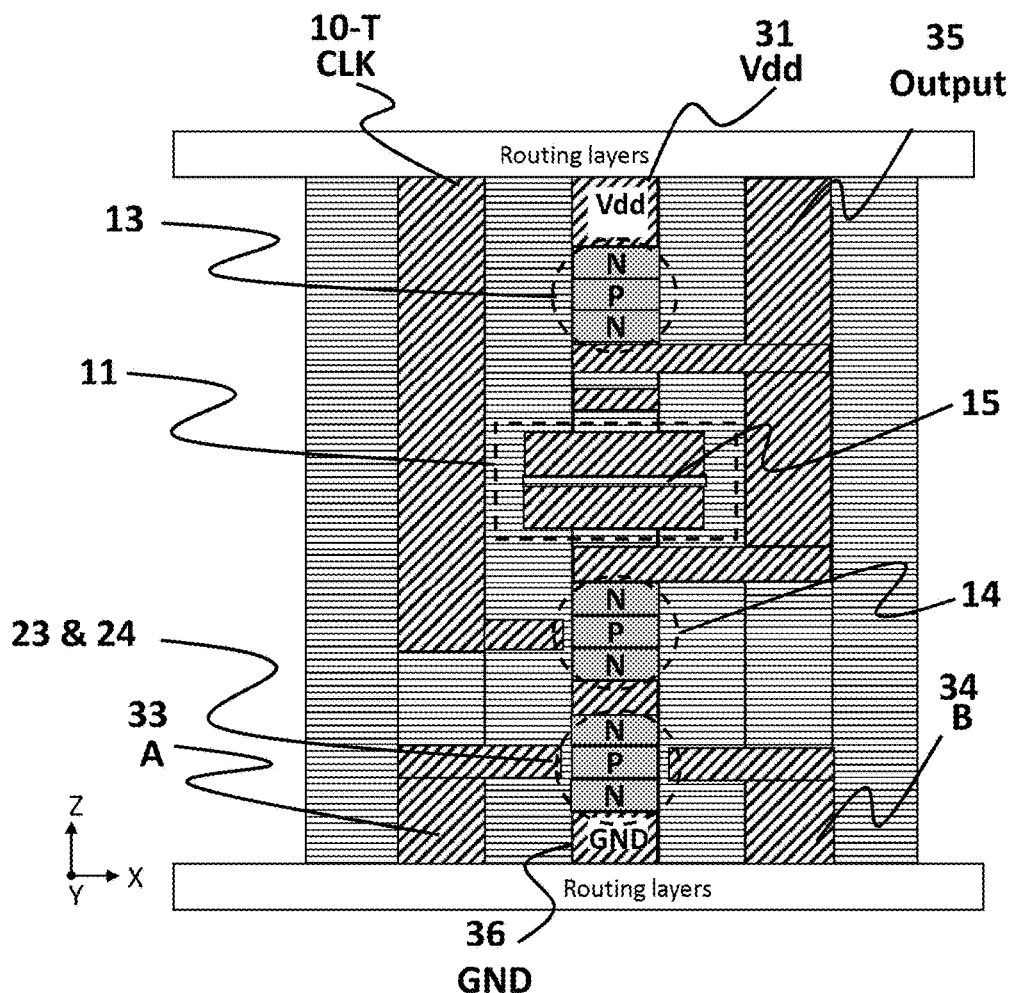
FIG. 4I is a Cross-sectional view of a Vertical Structure of a Unipolar Latched NOR Gate (N-type) according to an embodiment of the present invention.
Figure 4J:
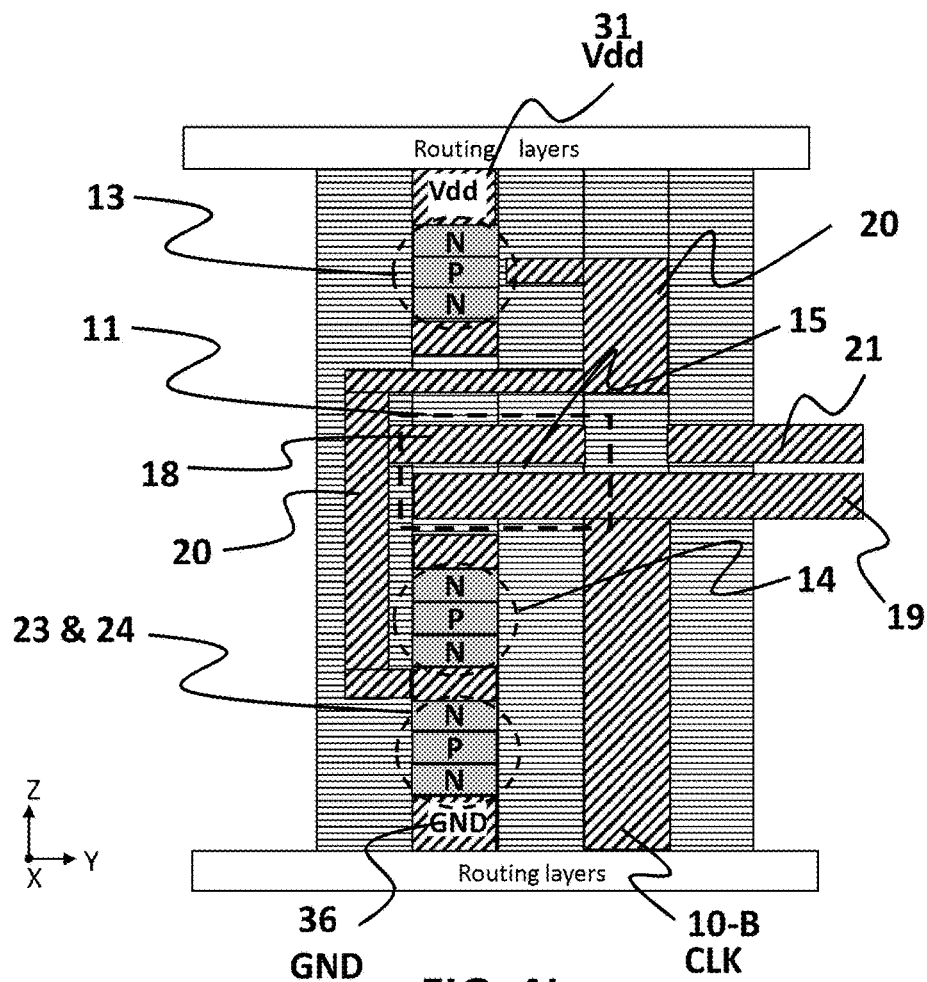
FIG. 4J is a Cross-sectional view of a Vertical Structure of a Unipolar Latched NOR Gate (N-type) according to an embodiment of the present invention.
Figure 4K:
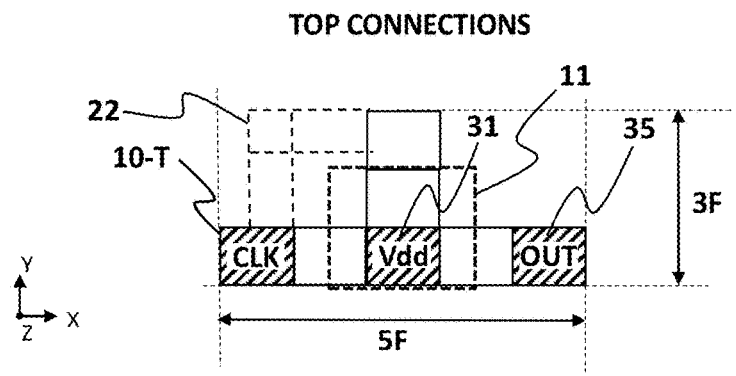
FIG. 4K is a plan view of the Top Layer Connections of a Vertical Unipolar Latched Gate (N-type) according to an embodiment of the present invention.
Figure 4L:
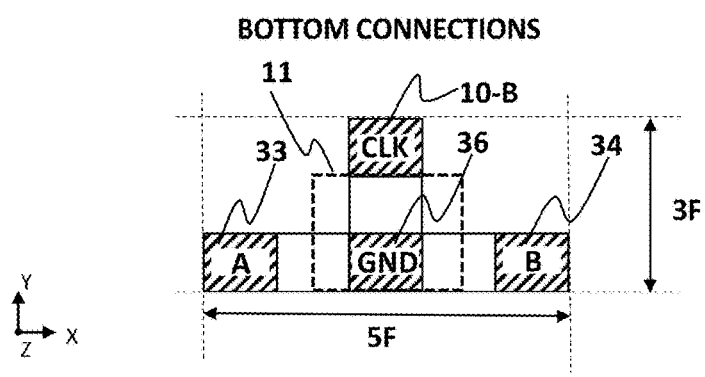
FIG. 4L is a plan view of the Bottom Layer Connections of a Vertical Unipolar Latched Gate (N-type) according to an embodiment of the present invention.

FIGS. 4K and 4L depict top views of the top and bottom connections, respectively, of the vertical structure of a unipolar latched NOR gate (N-type) as depicted in FIGS. 4I and 4J. Connections for gate routing may be made to the vertical gates either from above or below the gate structure. The CLK (10) signal is connected from either above or below the gate structure. For example, an electrode (22) conductively couples the top CLK connection (10-T) electrode depicted in FIG. 4K, to the bottom CLK connection (10-B) electrode depicted in FIG. 4L. To maximize density, the output (35) is connected from the top only and inputs A (33) and B (34) are connected from the bottom only as shown in FIG. 4K and FIG. 4L. Alternatively, output (35) and inputs A (33) and B (34) may be routed to both the top and bottom of the gate array, however that would require an increase of the gate cell area. Other arrangements of connections may also be made without departing from the spirit of the invention. 4M is an illustration of one method of creating an array of Vertical Unipolar Latched Gates with an average cell size approximately equal to 18 $F^2$ according to an embodiment of the present invention. If the manufacturing tolerance is relaxed in making electrode (20) (FIG. 4J) and/or an RC Network (26) is added to the Vertical Unipolar Latched Gate circuit, additional area of 6 $F^2$ per gate may be required which would bring the average cell size approximately equal to 24 $F^2$.

Figure 4M:
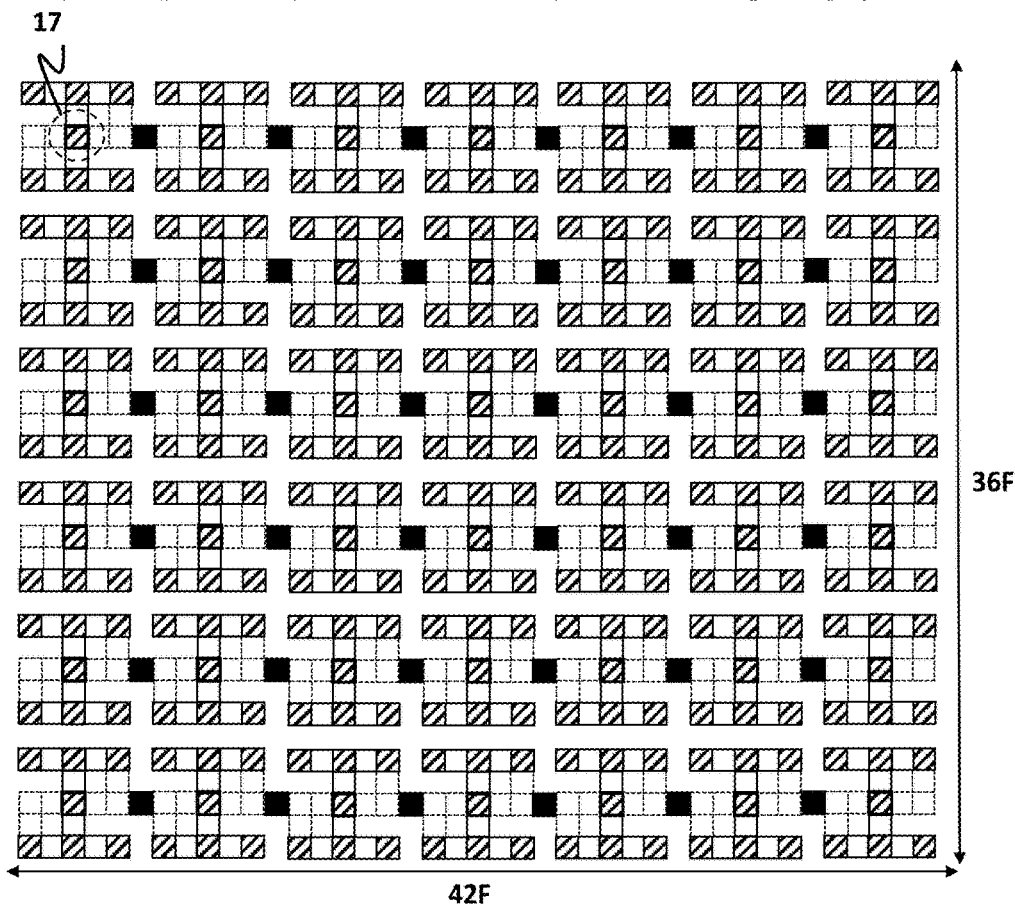
FIG. 4M is a plan view of an array of Vertical Unipolar Latched Gates with an average cell size approximately equal to 18 $F^2$ according to an embodiment of the present invention.

Other orientations than shown in FIG. 4G and FIG. 4M may be designed including flipping a portion or all of the gates in the X, Y, or Z direction. The layout illustrations described here are a factor of about 5 times smaller compared to conventional planar CMOS logic. In addition to a large increase in density, the short interconnect between logic gates provides for much faster speed of operation.

Figure 5:
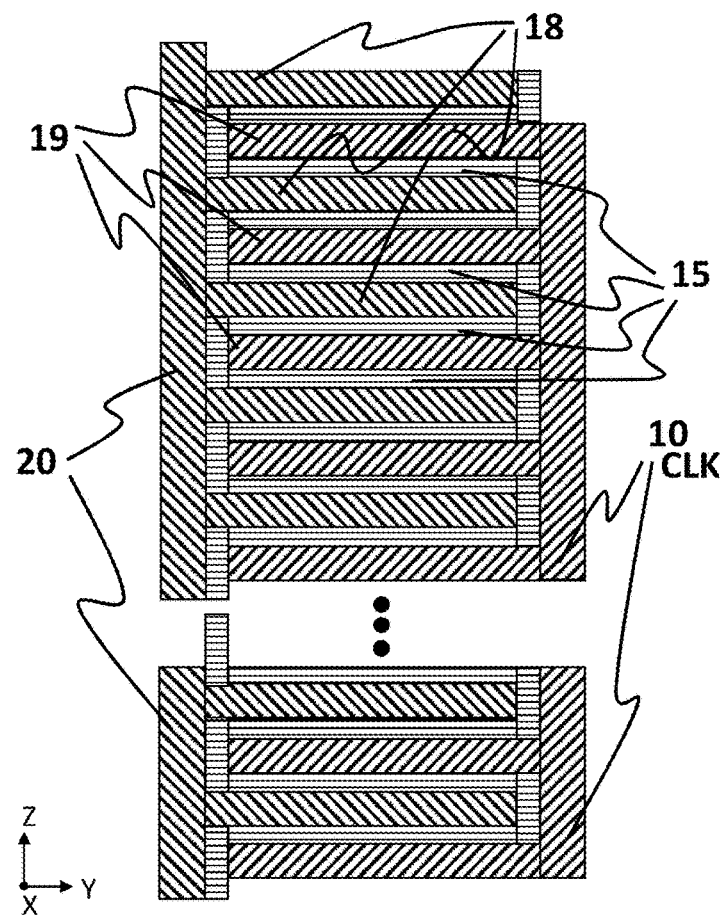
FIG. 5 is a cross-sectional view of a multilayer horizontal parallel plate capacitor (11) design according to an embodiment of the present invention.

FIG. 5 is an illustration of a multilayer horizontal parallel plate capacitor (11) design according to an embodiment of the present invention. Capacitor (11) may be fabricated in any one of several methods known in the art, or those under development, with a host of various dielectric materials and conductive plates. Depending on the energy storage requirements of capacitor (11), the capacitor shown in FIG. 5 may occupy several of the metal layers above the transistor circuitry and/or below the transistor circuitry in the case where TFTs are employed. Other techniques such as trench capacitors—used to great extent in the long history of DRAM fabrication—may be employed to achieve the necessary energy storage requirements. The thin dielectric material (15) may be comprised of conventional materials such as $SiO_2$ or high permittivity materials such as $BaTiO_3$, $BaSnO_3$, or other materials available now or in the future which increase capacitance. Hence there is a wide variety of methods by which the designer may design capacitor (11) for the right physical size and energy storage; alternative methods to those described herein may be used without departing from the scope or spirit of the present disclosure.

It should be noted that one skilled in the art will recognize that although embodiments of the unipolar latched logic circuitry shown herein are mainly drawn related to NOR gates, one skilled in the art would readily recognize that the invention applies also to other logic gates.

Figure 6:
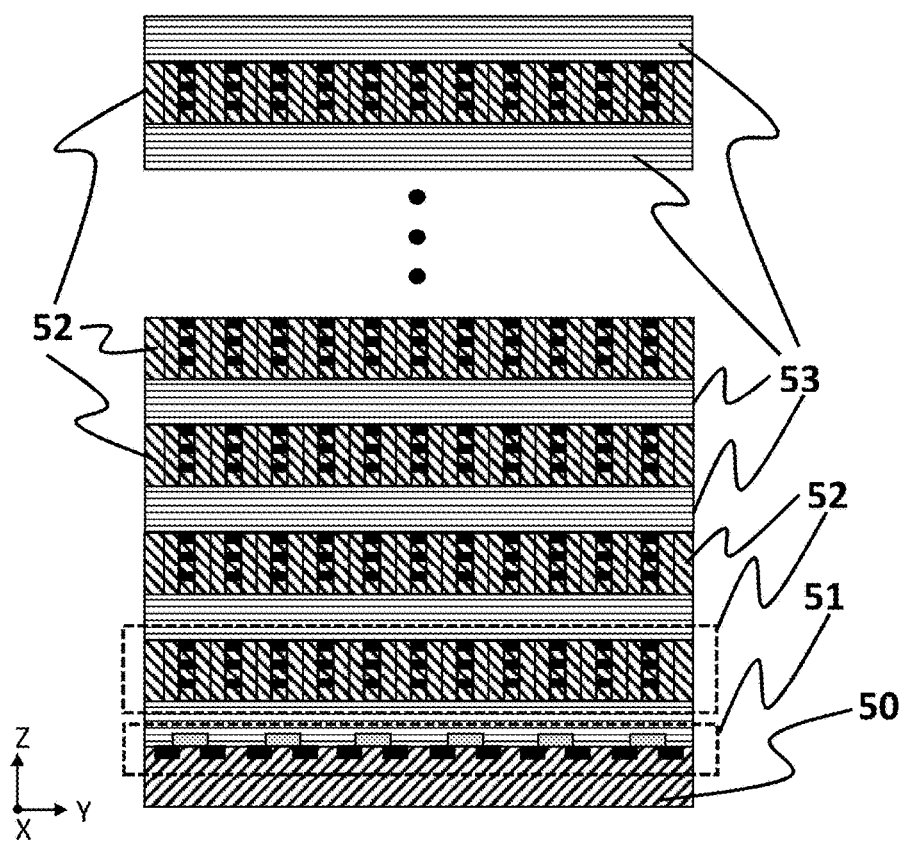
FIG. 6 is a cross-sectional view of a hybrid unipolar latched logic integrated circuit comprising of multiple layers of logic of at least two semiconductor material types.

The unipolar logic circuitry and vertical structures shown herein may be utilized with thin film transistors (TFTs) which may be fabricated on low cost insulative substrates such as glass or plastic or on insulative layers above circuitry which has been fabricated on semiconductor substrates. All TFT materials existing today or that may be developed in the future apply to various embodiments disclosed herein, including but not limited to a-Si, poly-Si, amorphous metal oxide semiconductors such as IGZO, IZTO, and Ln-IZO and organic thin film transistors. Additional materials are described in co-pending patent application PCT/US2016/24173, filed Mar. 25, 2016. TFTs shall include all transistors that are fabricated above the device substrate and are not required to be electrically coupled to the substrate. Alternatively, the unipolar logic circuitry may be utilized on a variety of semiconductor substrates which may be made of any appropriate semiconductor materials, such as silicon, polysilicon, germanium on insulator (GOI), silicon germanium, carborundum, indium antimonite, indium nitride, lead telluride, indium arsenide, indium phosphide, gallium arsenide, indium gallium arsenide, gallium antimonite, gallium nitride, alloy semiconductor, or a combination thereof. In yet another embodiment, unipolar logic circuitry may be fabricated with TFTs either in 2D planar or 3D vertical structures above unipolar logic circuitry embedded in a semiconductor substrate. This enables hybrid structures with ultra-high performance, density and speed. For example, InAs exhibits high electron mobility of 30,000-40,000 $cm^2$/Vs, and is a promising candidate along with other compound semiconductors for the semiconductor technology to replace silicon. However, vertical logic gates fabricated with compound semiconductors may not be as feasible as it is with TFTs which can be fabricated at low process temperatures (<400 C). Hence, to maximize overall speed, density, power and cost, a hybrid device may be fabricated for example, as shown in FIG. 6, utilizing a base layer of unipolar latched logic circuitry (51) of a first type of semiconductor material (such as InAs) embedded in the semiconductor substrate (50) with one or more additional unipolar latched logic circuitry layers (52) above the semiconductor substrate, made of a second type of semiconductor material (such as IGZO) comprised of TFT-based logic gates (which may be of the vertical type) fabricated above the core logic circuitry made of the first type of semiconductor material. A routing layer (53) may be positioned between circuitry layers and provides for the interconnections between gates and connections for Vdd (31) and Ground (36) through one or more metal layers.

Embodiments of the invention described herein may be applied to a variety of nonvolatile logic techniques; for example, a nonvolatile unipolar latched logic gate may employ a nonvolatile element such as the nonvolatile latch described in FIG. 15 of provisional application 62/252,522 and U.S. Pat. No. 8,681,535, (Agan et al) both of which are herein incorporated by reference in their entirety.

Figure 7:
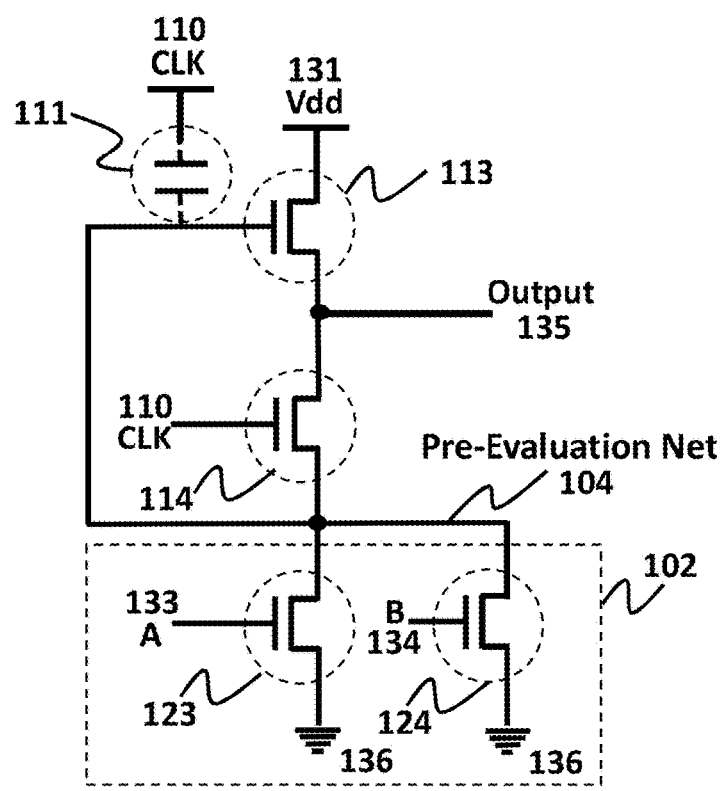
FIG. 7 is a schematic diagram of an embodiment of a unipolar logic gate configured to perform a NOR logic function.

FIG. 7 is a schematic diagram of an embodiment of a unipolar logic gate configured to perform a NOR logic function. In FIG. 7, NOR gate 100 includes clock input terminal 110, logic input terminals 133 and 134, and logic output terminal 135. Clock input terminal 110 is configured to receive a clock signal Logic input terminals 133 and 134 are configured to receive one or more corresponding logic input signals of a binary logical nature. Logic output terminal 135 is configured to output a logic output signal of a binary logical nature. NOR gate 100 also includes logic network 102 that includes device 123 and device 124 of a unipolar type. Devices 123 and 124 are configured to perform the NOR logic function. Each of the devices 123 and 124 of logical network 102 has a control node (e.g., gate) coupled to a corresponding one of the logic input terminals 133 and 134. Logic network 102 is configured to modulate conductivity, based on the configured logic function (e.g., NOR) and the logic input signals received on logic input terminals 133 and 134, between first supply 136 (e.g., GND) and pre-evaluation net 104.

NOR gate 100 includes logic clocking device 114 of the unipolar type having an input node (e.g., source/drain) coupled to pre-evaluation net 104, a control node (e.g., gate) conductively coupled to clock input terminal 110, and an output node (e.g., source/drain) coupled to logic output terminal 135. Logic clocking device 114 is configured to modulate conductivity, based on the received clock signal on clock input terminal 110, between pre-evaluation net 104 and logic output terminal 135.

The NOR gate includes logic-complement clocking device 113 of the unipolar type having an input node (e.g., source/drain) coupled to second supply 131 (e.g., VDD), a control node (e.g., gate) capacitively coupled, via capacitor 111, to clock input terminal 110 and conductively coupled to pre-evaluation net 104, and an output node (e.g., source/drain) coupled to logic output terminal 135, logic-complement clocking device 113 configured to modulate conductivity, based on the received clock signal on clock input terminal 10, between second supply 131 and logic output terminal 135.

In the depicted embodiment, the pre-evaluation net can be charged to a voltage substantially above first supply 136 when the clock signal received on clock input terminal 110 transitions from low to high and the conductivity of the logic network is low. If, however, the conductivity of the logic network is high or the clock signal received on clock input terminal 110 transitions from high to low, the voltage of the pre-evaluation net will be not significantly above first supply 136. If the unipolar type of the depicted devices 113, 114, 123 and 124 is N-type, pre-evaluation net must have a voltage significantly above first supply 136 for logic-complement clocking device 113 to turn on and to provide a high conductivity path between second supply 131 and logic output terminal 135.

Figure 8A:
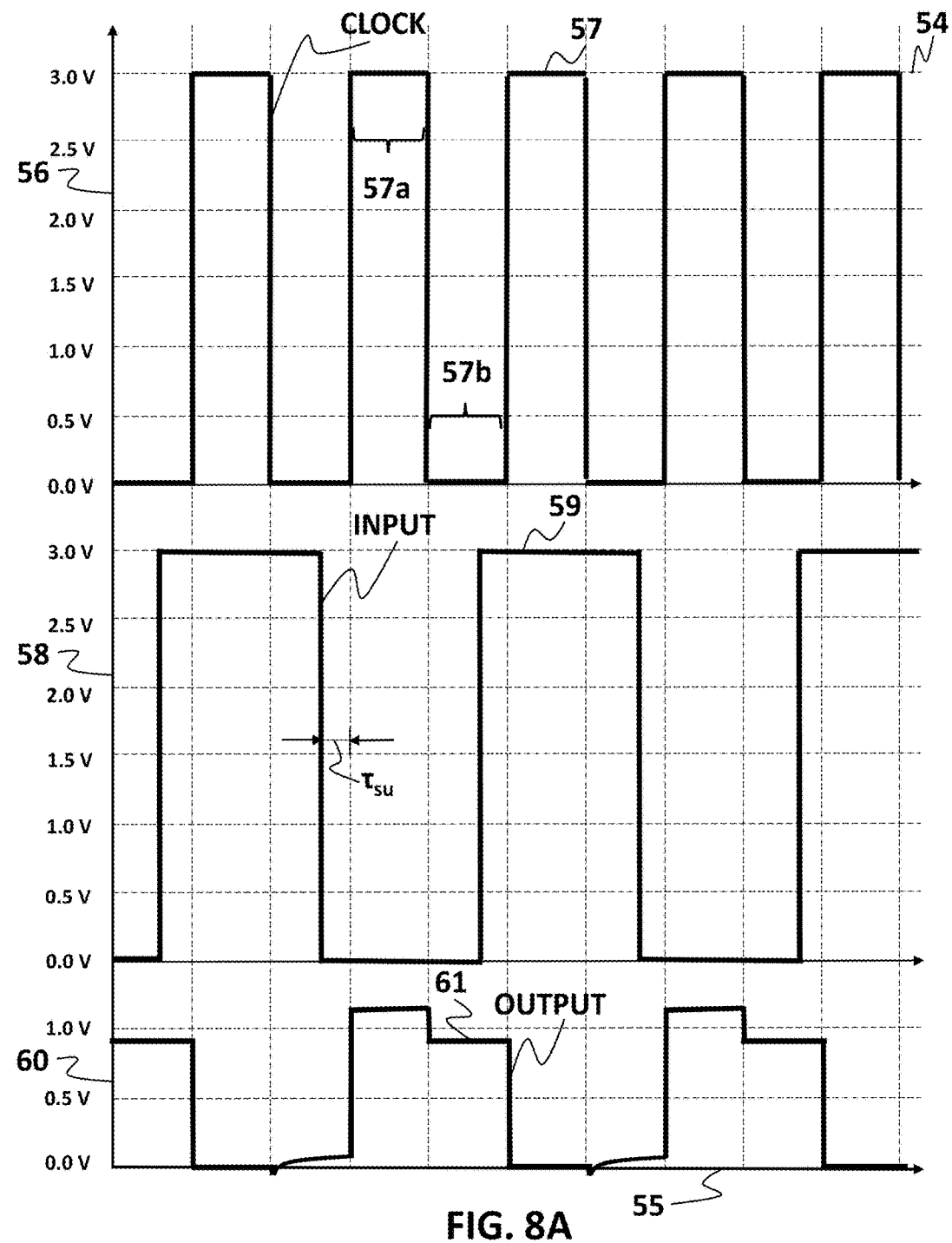
FIGS. 8A-8B are graphs depicting clock, logic inputs, logic outputs, and current drawn by an exemplary Unipolar Latched Logic Circuit.
Figure 8B:
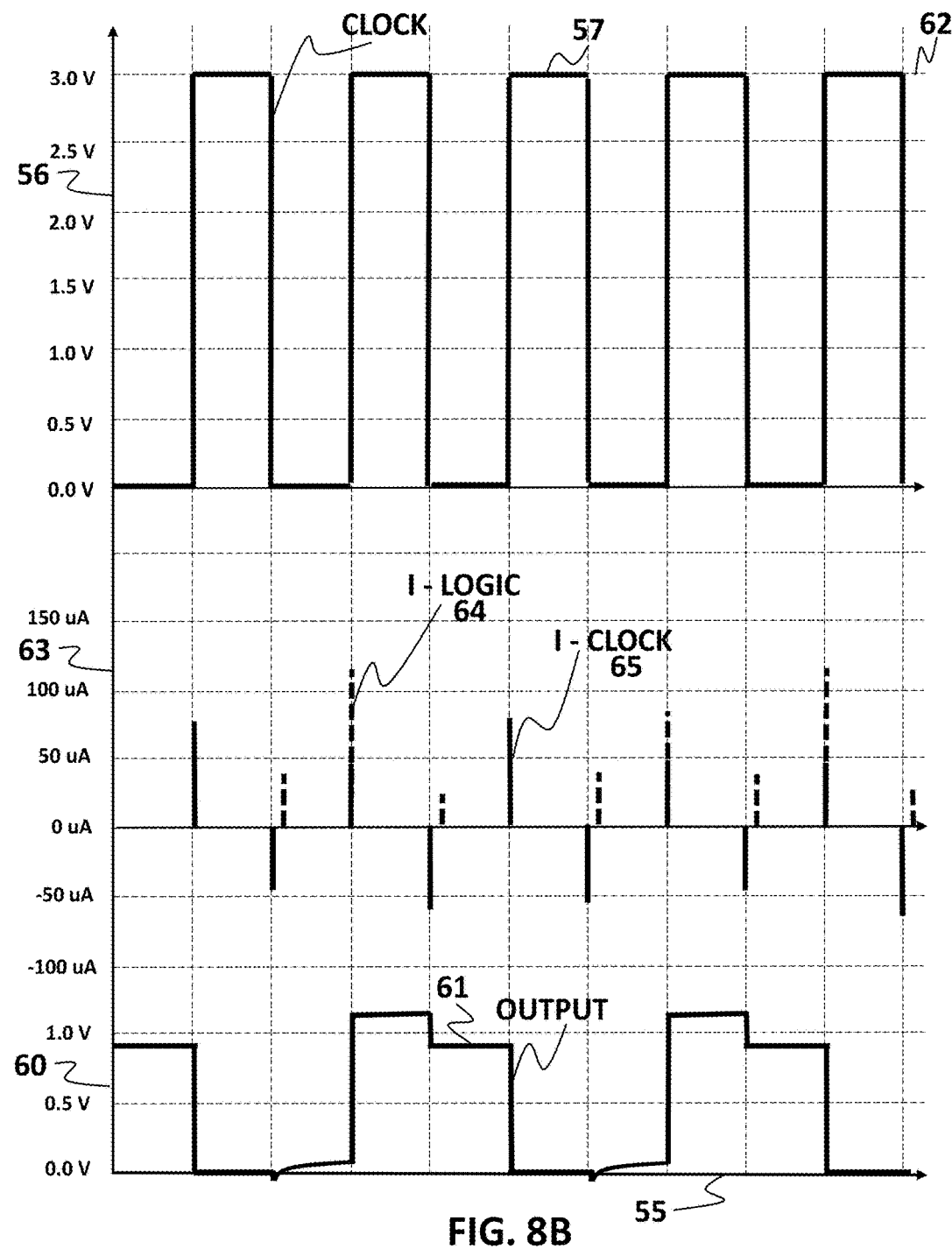

FIGS. 8A-8B are graphs depicting clock, logic inputs, logic outputs, and current drawn by an exemplary Unipolar Latched Logic Circuit. In FIG. 8A, graph 54 includes horizontal axis 55 and vertical axes 56, 58, and 60. Horizontal axis 56 is indicative of time. Vertical axes 56, 58, and 60 are indicative of clock voltage, input logic voltage, and output voltage, respectively. Clock signal/time relation 57 depicts a periodic clock signal that is at 3.0 volts during first phase 57a and at 0.0 volts during second phase 57b. First phase 57a can be called an evaluation phase, and second phase 57b can be called a hold phase.

Input logic signal/time relation 59 depicts a logic signal that varies between 0.0 volts and 3.0 volts as a function of time. Input logic signal/time relation 59 is constant during the evaluation phase 57a and changing at time $\tau_{su}$ before clock signal/time relation 57 transitions to hold phase 57b. When the clock signal depicted in clock signal/timing relation 57 transitions from hold phase 57b to evaluation phase 57a, the output logic signal as depicted in output logic signal/time relation 61 to a logic state indicative of a logic function corresponding to a configuration of unipolar devices and the input logic signal as depicted in input logic function/time relation 59. When the clock signal depicted in clock signal/timing relation transitions from evaluation phase 57a to hold phase 57b, the output logic signal is held at the previously determined output logic level, independent of the voltage of the input logic signal as indicated in input logic signal/time relation 59.

In FIG. 8B, graph 62 includes horizontal axis 55 and vertical axes 56, 63, and 60. As depicted in FIG. 7A, horizontal axis 55 is again indicative of time. Vertical axes 56, 63, and 60 are indicative of clock voltage, current, and output voltage, respectively. Clock signal/time relation 57 and output logic signal/time relation 61 depicted in FIG. 7A are reproduced in FIG. 7B to provide a reference to the supply current signal/time relation 64 and clock current/time relation 65. Both supply current signal/time relation 64 and clock current/time relation 65 are modest, because the timing of the various unipolar devices of the unipolar latched logic gate (e.g., as depicted in FIG. 1A) is such that no crowbar current paths are formed.

In some embodiments, evaluation phase 57a of clock signal/time relation 57 can have a voltage level that exceeds a supply voltage. Such a clock-signal/time relation can provide increased conductivity of logic-complement clocking device 113 (depicted in FIG. 7). This can ensure that the output signal on logic output terminal 135 is with a predetermined logic level specification, for example. Various capacitive techniques can provide such a clock signal/time relation 57 that exceeds a supply voltage.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. An electronic device for performing a logic function comprising:
    a clock input terminal configured to receive a clock signal having first and second phases;
    one or more logic input terminals configured to receive one or more corresponding logic input signals;
    a logic output terminal configured to output a logic output signal;
    a logic network including one or more devices of a unipolar type configured to perform the logic function, each of the one or more devices of the logical network having a control node coupled to a corresponding one of the logic input terminals, the logic network configured to modulate conductivity, based on the logic function that the logic network is configured to perform and the logic input signals received on the logic input terminals, between a first supply node and a pre-evaluation net;
    a logic clocking device of the unipolar type having an input node coupled to the pre-evaluation net, a control node coupled to the clock input terminal, and an output node coupled to the logic output terminal, the logic clocking device configured to modulate conductivity, based on the clock signal received on the clock input terminal, between the pre-evaluation net and the logic output terminal; and
    a logic-complement clocking device of the unipolar type having an input node coupled to a second supply, a control node capacitively coupled to the clock input terminal and coupled to the pre-evaluation net, and an output node coupled to the logic output terminal, the logic-complement clocking device configured to modulate conductivity, based on the clock signal received on the clock input terminal, between the second supply and the logic output terminal.

2. The electronic device of claim 1, further comprising a capacitor coupled between the clocking terminal and the pre-evaluation net.

3. The electronic device of claim 1, wherein the control node of the logic-complement clocking device is coupled to the logic-network output node via a resistor.

4. The electronic device of claim 1, wherein the control node of the logic-complement clocking device is coupled to the logic-network output node via a resistor-capacitor network.

5. The electronic device of claim 1, wherein the unipolar type comprises N-type MOS transistors.

6. The electronic device of claim 1, wherein the unipolar type comprises P-type MOS transistors.

7. The electronic device of claim 1, wherein the logic network includes a plurality of devices of the unipolar type wired in a parallel fashion.

8. The electronic device of claim 1, wherein the logic network includes a plurality of devices of the unipolar type wired in a series fashion.

9. The electronic device of claim 1, wherein voltage of the clock signal during the first phase exceeds the second supply voltage.

10. The electronic device of claim 1, wherein, during the first phase of the clock signal, an output signal is generated on the logic output terminal, the output signal being indicative of a result of the logic function that the logic network is configured to perform operating on the logic input signals received on the logic input terminals.

11. The electronic device of claim 1, wherein, during the second phase of the clock signal, the output signal on the logic output terminal generated during an immediately preceding first phase is held independent of the logic input signals received on the logic input terminals.

12. A series-connected pair of electronic devices of claim 1, wherein the clock signal received on the clock input terminal of a first electronic device is a logic clock signal, and the clock signal received on the clock input terminal of a second electronic device is an inverted and/or complementary logic clock signal, wherein the logic clock signal and the inverted and/or complementary logic clock signal are non-overlapping signals.

13. A method for generating an electronic logic state:
    receiving a periodic clock signal alternating between a first state during an evaluation phase and a second state during a hold phase;
    capacitively coupling the received periodic clock signal to a pre-evaluation net;
    receiving one or more logic signals;
    arranging one or more devices of a unipolar type to perform a logical function;
    modulating conductivity, based on the received one or more logic signals and the arranged logical function, between a first supply node and the pre-evaluation net; and modulating conductivity, based on a voltage on the pre-evaluation net, between a second supply node and a logic output terminal.

14. The method of claim 13, further comprising:
modulating conductivity, based on the received clock signal, between the pre-evaluation net and the logic output terminal.

15. The method of claim 14, further comprising:
generating an output signal, based in part on the modulated conductivity between the first supply node and the pre-evaluation net, on the modulated conductivity between the second supply node and a logic output terminal, and on the modulated conductivity between the pre-evaluation net and the logic output terminal.

16. An electronic device for performing a logic function, the electronic device comprising:
a clock terminal configured to receive a periodic-clock signal alternating between a first clock voltage during an evaluation phase and second clock voltage during a hold phase;
a capacitor coupled between the clock terminal and a pre-evaluation net;
a logic network including one or more devices of a unipolar type configured to perform the logic function, the logic network electrically coupled between the pre-evaluation net and a first supply node and having a conductivity therebetween modulated, based on the logic function and logic input signals received by the logic network, wherein, during the evaluation phase of the periodic-clock signal, the pre-evaluation net is charged to a voltage determined by the first clock voltage of the periodic-clock signal, a first supply voltage of the first supply node, and by an impedance ratio of capacitance of the capacitor to the modulated conductivity of the logic network; and
a logic-complement clocking device of the unipolar type electrically coupled between a second supply node and an output terminal of the electronic device and having a conductivity therebetween modulated based on the charged voltage of the pre-evaluation net.

17. The electronic device of claim 16, further comprising:
a logic clocking device of the unipolar type electrically coupled between the pre-evaluation net and the output terminal of the electronic device and having a conductivity therebetween modulated based on the periodic clock signal.

18. The electronic device of claim 17, wherein an output signal on the output terminal is generated, based in part on the modulated conductivity between the first supply node and the pre-evaluation net, on the modulated conductivity between the second supply node and a logic output terminal, and on the modulated conductivity between the pre-evaluation net and the logic output terminal.

19. The electronic device of claim 16, wherein the output signal is based, in part, on a difference between supply voltages on the first and second supply nodes.

20. The electronic device of claim 16, wherein the logic network includes a plurality of devices of the unipolar type wired in a parallel fashion.

* * * * *